(12) United States Patent
Maemoto

(10) Patent No.: US 6,905,803 B2
(45) Date of Patent: Jun. 14, 2005

(54) LITHOGRAPHIC PRINTING PLATE PRECURSOR

(75) Inventor: Kazuo Maemoto, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 10/617,684

(22) Filed: Jul. 14, 2003

(65) Prior Publication Data

US 2004/0023146 A1 Feb. 5, 2004

Related U.S. Application Data

(62) Division of application No. 09/870,671, filed on Jun. 1, 2001, now Pat. No. 6,632,580.

(30) Foreign Application Priority Data

| Jun. 2, 2000 | (JP) | P.2000-165998 |
| Jul. 13, 2000 | (JP) | P.2000-212897 |
| Aug. 1, 2000 | (JP) | P.2000-233088 |

(51) Int. Cl.⁷ .......... G03F 7/004; B41C 1/055
(52) U.S. Cl. ........ 430/14; 430/270.1; 430/302; 430/944; 430/278.1; 430/18; 101/456; 101/457
(58) Field of Search .......... 430/270.1–288.1, 430/302, 303, 18, 14; 101/456, 457

(56) References Cited

U.S. PATENT DOCUMENTS

| 4,186,069 A | * | 1/1980 | Muzyczko et al. ....... 430/175 |
| 4,501,810 A | * | 2/1985 | Fromson et al. ........ 430/302 |
| 4,879,201 A | | 11/1989 | Hasegawa |
| 4,999,273 A | | 3/1991 | Hasegawa |
| 5,141,969 A | | 8/1992 | Saeva et al. |
| 5,516,620 A | | 5/1996 | Cheng et al. |
| 5,658,708 A | | 8/1997 | Kondo |
| 6,350,403 B1 | | 2/2002 | Melisaris et al. |
| 2001/0018159 A1 | | 8/2001 | Maemoto |
| 2002/0100385 A1 | * | 8/2002 | Yamasaki ............ 101/456 |

FOREIGN PATENT DOCUMENTS

| DE | 197 81 578 C2 | 11/2001 |
| EP | 0 536 690 A | 4/1993 |
| EP | 0 770 494 A2 | 5/1997 |
| EP | 1 116 580 A2 | 7/2001 |
| EP | 1 132 200 A | 9/2001 |
| EP | 1 145 848 A2 | 10/2001 |
| JP | 8-220752 A | 8/1996 |
| JP | 09 127683 A | 5/1997 |
| WO | WO99/10186 A | 3/1999 |
| WO | WO 01/25340 j A1 * | 4/2001 |

OTHER PUBLICATIONS

Product data sheet Epikote Tm Resin 1002, Resolution Performance Products, Re–issued Sep. 2002, two pages, obtained from a websearch on Google for Epikote resin 1002.*

English Abstract of JP09127683 presented by Applicants.

* cited by examiner

Primary Examiner—Cynthia Hamilton
(74) Attorney, Agent, or Firm—Burns, Doane, Swecker & Mathis, L.L.P.

(57) ABSTRACT

A lithographic printing plate precursor is disclosed, which comprises an image-forming layer which contains a hydrophilic resin, an acid precursor and at least one component selected from fine particles containing a compound having a vinyloxy group and microcapsules containing a compound having a vinyloxy group, on a hydrophilic support, which can be development processed on a printing machine.

5 Claims, No Drawings

LITHOGRAPHIC PRINTING PLATE PRECURSOR

This application is a divisional of application Ser. No. 09/807,671, filed on Jun. 1, 2001, now U.S. Pat. No. 6,632,580.

FIELD OF THE INVENTION

The present invention relates to a negative working (or type)lithographic printing plate precursor which comprises a hydrophilic support having provided thereon an image-forming layer, more specifically relates to a lithographic printing plate precursor capable of image-recording by infrared ray scanning exposure on the basis of digital signals, and the image-recorded printing plate precursor can be mounted immediately on a printing machine for plate-making by on-press development.

BACKGROUND OF THE INVENTION

A variety of studies are going ahead on the plate-making technique for computer-to-plate system which has progressed increasingly in recent years. Of such techniques, as those aiming at further rationalization of processes and the solution of the problem of waste solution treatment, lithographic printing plate precursors which can be mounted on a printing machine immediately after exposure without undergoing development process and can be used for printing have been researched and various methods are suggested.

As one method of doing away with a treating process, there is a method called on-press development comprising the steps of loading an exposed printing plate precursor onto the plate cylinder of a printing machine and supplying a fountain solution and an ink with rotating the plate cylinder to thereby remove the non-image domain of the coated layer of the printing plate precursor. That is, this is a method of exposing a lithographic printing plate precursor, loading it immediately onto a printing machine and effecting developing treatment in a general printing process.

Such a lithographic printing plate precursor suitable for on-press development is required to have a photosensitive layer soluble in a fountain solution or an ink solvent and have daylight handleability capable of undergoing development on a printing machine in a bright room.

For example, a lithographic printing plate precursor comprising a hydrophilic support having provided thereon a photosensitive layer comprising a hydrophilic binder polymer having dispersed therein fine particles of a thermoplastic hydrophobic polymer is disclosed in Japanese Patent 2938397. This is disclosed in this patent to coalesce thermoplastic hydrophobic polymer fine particles by the heat of infrared laser exposure to form an image on a lithographic printing plate precursor, and to mount the printing plate precursor on the cylinder of a printing machine to perform on-press development with a fountain solution and/or an ink. Due to the sensitive region being infrared rays, the printing plate precursor is handleable in daylight.

Further, the techniques of coalescing thermoplastic fine particles by heat and making a printing plate by on-press development are also disclosed in JP-A-9-127683 (the term "JP-A" as used herein means an "unexamined published Japanese patent application") and WO 99/10186.

However, these methods of making an image by the coalescence of fine particles by heat are accompanied by the problem that high press life (i.e., high printing durability) is difficult to obtain, although good on-press developability can be obtained.

SUMMARY OF THE INVENTION

An object of the present invention is to solve this problem, that is, to provide a lithographic printing plate precursor having good on-press developability and high press life (the term "press life" is sometimes called "printing durability" or "run length".).

The above object of the present invention has been achieved by the following means.

(1) A lithographic printing plate precursor which comprises an image-forming layer which contains a hydrophilic resin, an acid precursor and at least one component selected from fine particles containing a compound having a vinyloxy group and microcapsules containing a compound having a vinyloxy group, on a hydrophilic support.

(2) A lithographic printing plate precursor which comprises an image-forming layer which contains a hydrophilic resin, an acid precursor and at least one component selected from fine particles containing a compound having an epoxy group and microcapsules containing a compound having an epoxy group, on a hydrophilic support.

(3) A lithographic printing plate precursor which comprises a hydrophilic support having provided thereon an image-forming layer containing fine particles containing a thermosetting compound, and a hydrophilic resin.

(4) The lithographic printing plate precursor as described in the above item (1), wherein the fine particles containing a compound having a vinyloxy group or the microcapsules containing a compound having a vinyloxy group contain at least one component of an acid precursor and an infrared ray-absorbing dye.

(5) The lithographic printing plate precursor as described in the above item (1) or (4), wherein the fine particles containing a compound having a vinyloxy group or the microcapsules containing a compound having a vinyloxy group contain a compound having a functional group which reacts with a vinyloxy group.

(6) The lithographic printing plate precursor as described in the above item (1), (4) or (5), wherein the hydrophilic resin contains a functional group which reacts with a vinyloxy group.

(7) The lithographic printing plate precursor as described in the above item (2), wherein the fine particles containing a compound having an epoxy group or the microcapsules containing a compound having an epoxy group contain at least one component of an acid precursor and an infrared ray-absorbing dye.

(8) The lithographic printing plate precursor as described in the above item (2) or (7), wherein the fine particles containing a compound having an epoxy group or the microcapsules containing a compound having an epoxy group contain a compound having a functional group which reacts with an epoxy group.

(9) The lithographic printing plate precursor as described in the above item (2), (7) or (8), wherein the hydrophilic resin contains a functional group which reacts with an epoxy group.

(10) The lithographic printing plate precursor as described in the above item (3), wherein the fine particles containing a thermosetting compound contain an infrared ray-absorbing dye.

(11) The lithographic printing plate precursor as described in the above item (3) or (10), wherein the thermosetting compound is at least a resin selected from a resin having a phenolic skeleton, a melamine resin and a urea resin.

(12) The lithographic printing plate precursor as described in any of the above items (1) to (11), wherein the hydrophilic support is an aluminum support which has been subjected to anodization treatment and hydrophilization treatment.

(13) The lithographic printing plate precursor as described in any of the above items (1) to (3), wherein the printing plate precursor is development processed on a printing machine.

DETAILED DESCRIPTION OF THE INVENTION

The present invention will be described in detail below.
Image-Forming Layer

A vinyloxy group for use in the present invention is represented by the following formula (I):

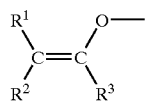
(I)

wherein $R^1$, $R^2$ and $R^3$, which may be the same or different, each represents a hydrogen atom, an alkyl group or an aryl group, and two of $R^1$, $R^2$ and $R^3$ may be bonded to form a saturated or olefinic unsaturated ring.

More specifically, when any of $R^1$, $R^2$ and $R^3$ represents an aryl group, the aryl group has generally from 6 to 20 carbon atoms, and may be substituted with an alkyl group, an aryl group, an alkoxyl group, an aryloxy group, an acyl group, an acyloxy group, an alkylmercapto group, an acylamino group, an alkoxycarbonyl group, a nitro group, a sulfonyl group, a cyano group, or a halogen atom.

When any of $R^1$, $R^2$ and $R^3$ represents an alkyl group or an alkenyl group, the alkyl group and the alkenyl group have a straight chain, branched or cyclic carbon chain generally having from 1 to 20 carbon atoms, and may be substituted with a halogen atom, a cyano group, an alkoxycarbonyl group, a hydroxyl group, an alkoxyl group, an aryloxy group, or an aryl group. Further, when any two of $R^1$, $R^2$ and $R^3$ are bonded to form a ring together with the carbon atom of the vinyl group, the ring is generally a saturated or unsaturated ring having generally from 3 to 8, preferably 5 or 6, carbon atoms.

In the present invention, of the vinyloxy groups represented by formula (I), a vinyloxy group wherein any one of $R^1$, $R^2$ and $R^3$ represents a methyl-group or an ethyl group and the remaining groups represent a hydrogen atom is more preferred, and a vinyloxy group (a vinyl ether group) wherein all of $R^1$ $R^2$ and $R^3$ represent hydrogen atoms is particularly preferred.

As the compounds having a vinyloxy group in the present invention, compounds having two or more vinyloxy groups represented by formula (I) are preferred. When two or more vinyloxy groups are contained, crosslinking can be carried out effectively, thus the effect of the present invention can be obtained easily. They are compounds having a boiling point of 60° C. or higher under atmospheric pressure. A compound represented by formula (II) or (III) shown below having a vinyl ether group is more preferably used.

(II)

(III)

wherein A represents an m-valent alkyl group, aryl group or heterocyclic group; B represents —CO—O—, —NHCOO— or —NHCONH—; $R^4$ represents a straight chain or branched alkylene group having from 1 to 10 carbon atoms; n represents 0 or an integer of from 1 to 10; and m represents an integer of from 2 to 6.

A compound represented by formula (II) can be synthesized by the methods described, e.g., in Stephen C. Lapin, *Polymers Paint Colour Journal*, 179 (4237), 321 (1988), i.e., by the reaction of a polyhydric alcohol or a polyhydric phenol with an acetylene, or by the reaction of a polyhydric alcohol or a polyhydric phenol with a halogenated alkyl vinyl ether.

The specific examples of the compounds represented by formula (II) include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropanetriethylene vinyl ether, trimethylolpropanediethylene vinyl ether, pentaerythritol diethylene vinyl ether, pentaerythritol triethylene vinyl ether, pentaerythritol tetraethylene vinyl ether, 1,2-di(vinyl ether methoxy)benzene, 1,2-di(vinyl ether ethoxy)benzene, and the following compounds represented by formulae (M-1) to (M-41), but the present invention is not limited thereto.

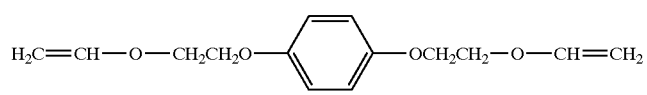
(M-1)

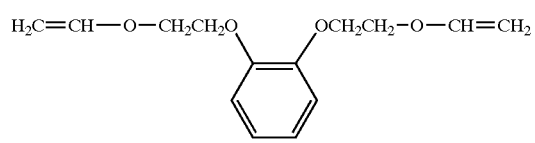
(M-2)

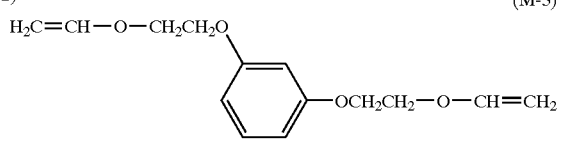
(M-3)

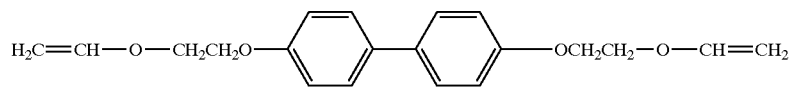
(M-4)

-continued
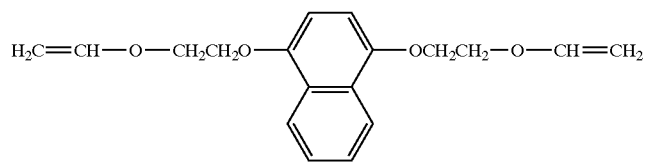
(M-5)
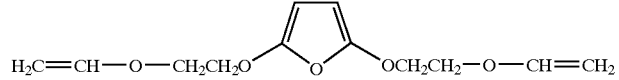
(M-6)
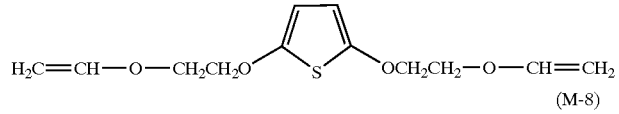
(M-7)
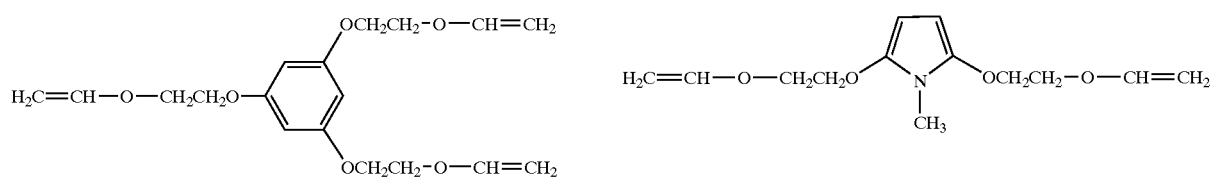
(M-8)
(M-9)
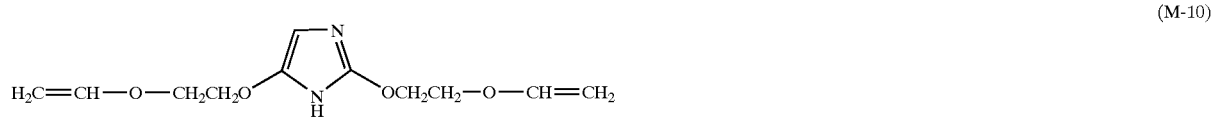
(M-10)
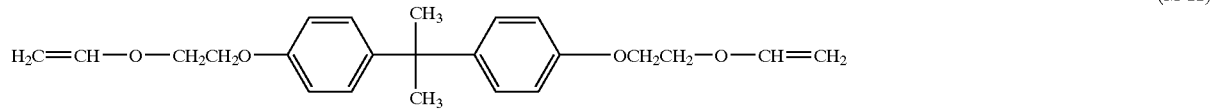
(M-11)
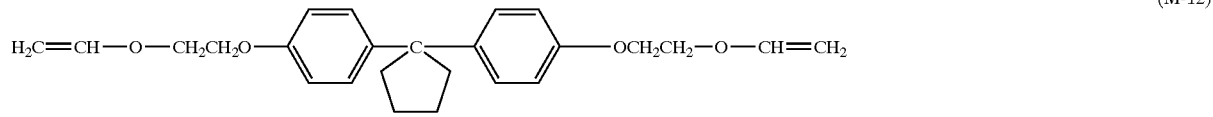
(M-12)
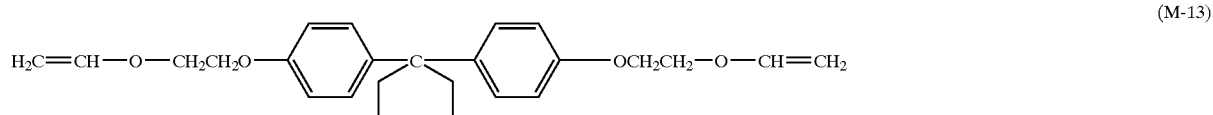
(M-13)
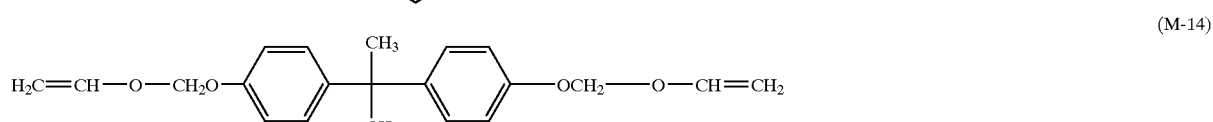
(M-14)
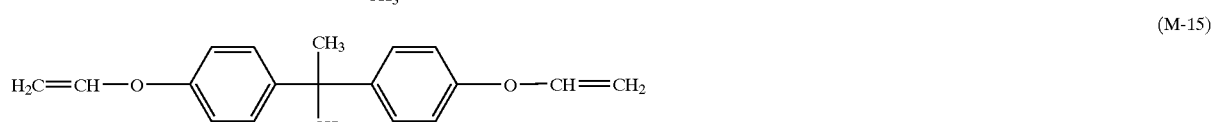
(M-15)
(M-16)
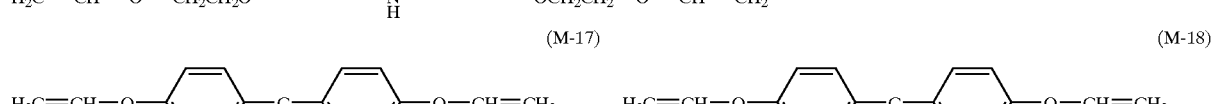
(M-17)  (M-18)

-continued
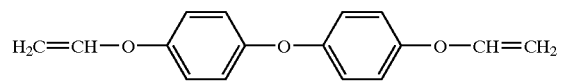
(M-19)
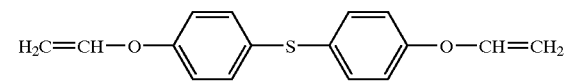
(M-20)
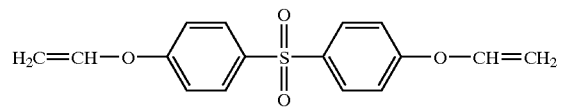
(M-21)
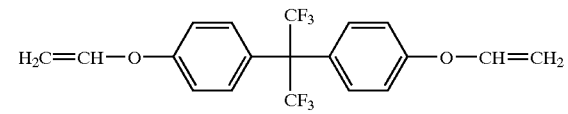
(M-22)
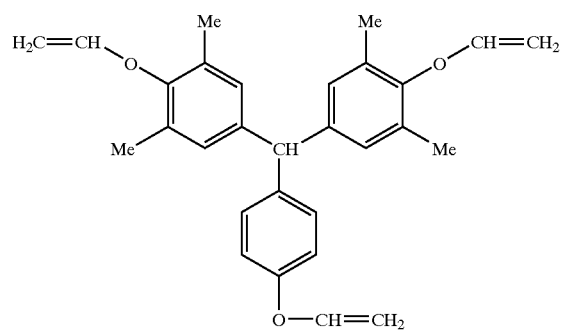
(M-23)
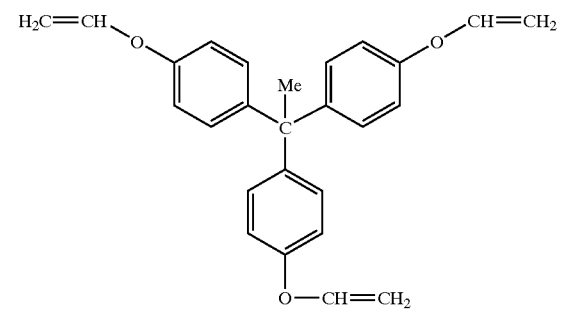
(M-24)
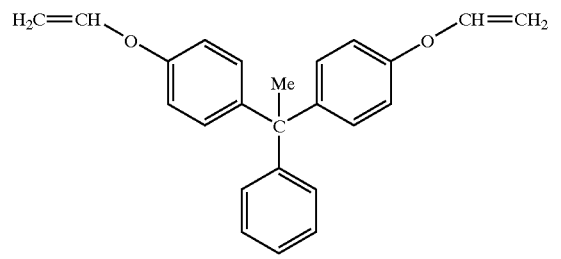
(M-25)
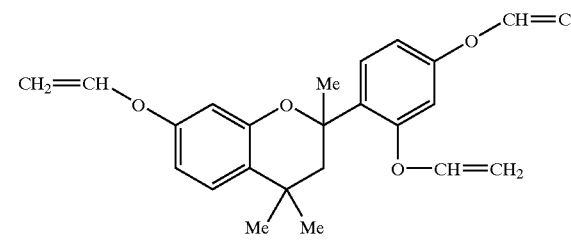
(M-26)
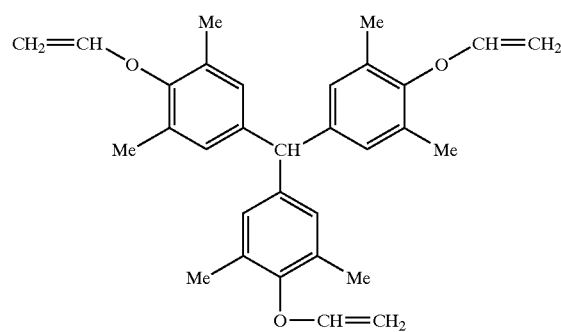
(M-27)
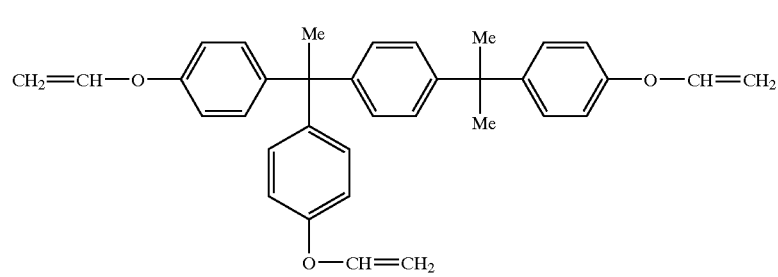
(M-28)

-continued
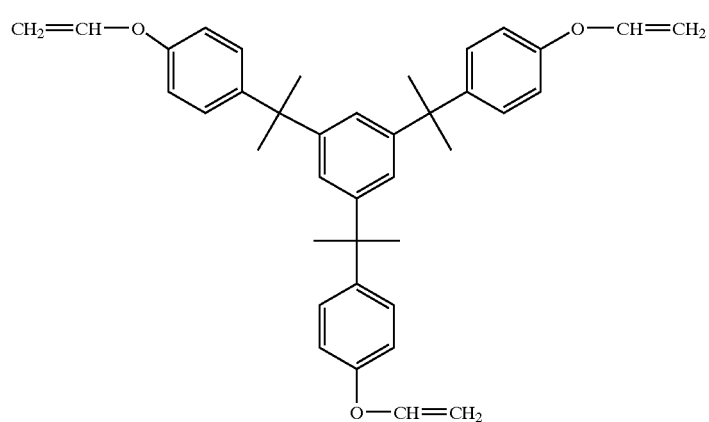
(M-29)
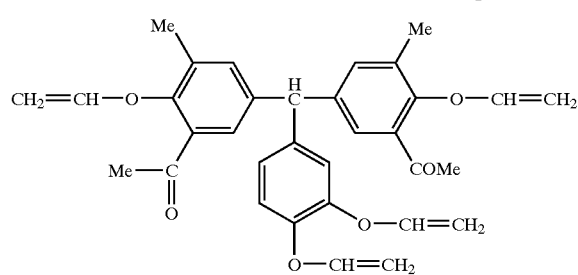
(M-30)
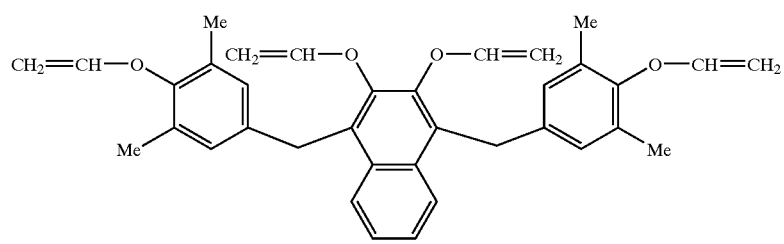
(M-31)
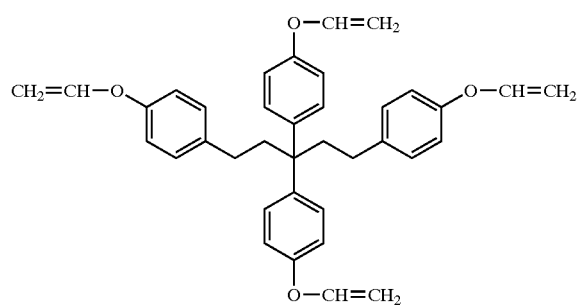
(M-32)
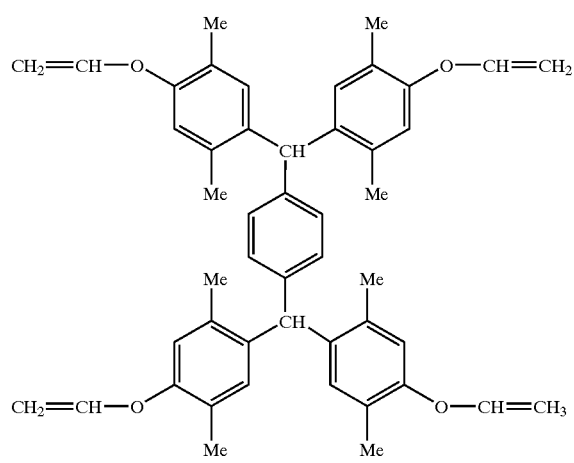
(M-33)
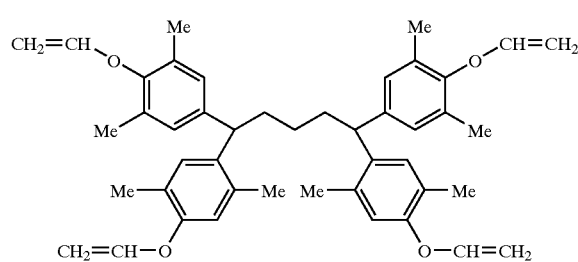
(M-34)
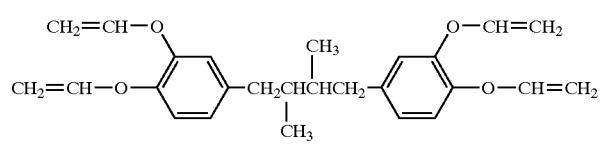
(M-35)

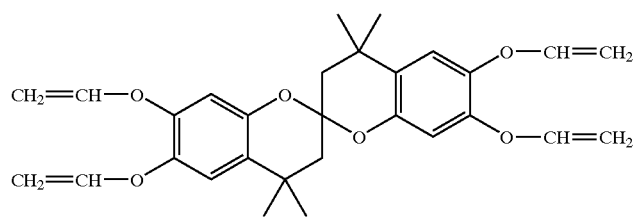
(M-36)

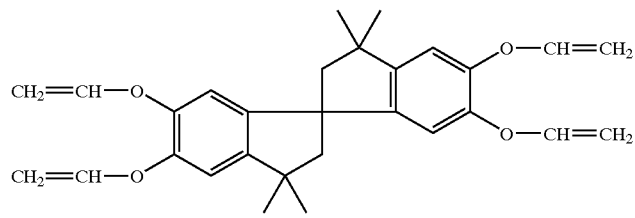
(M-37)

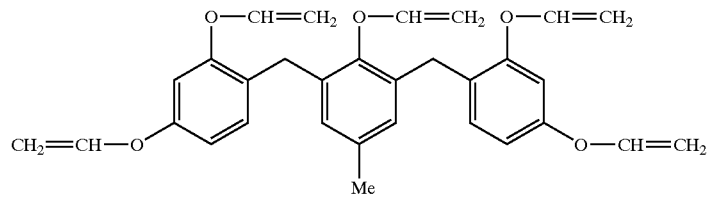
(M-38)

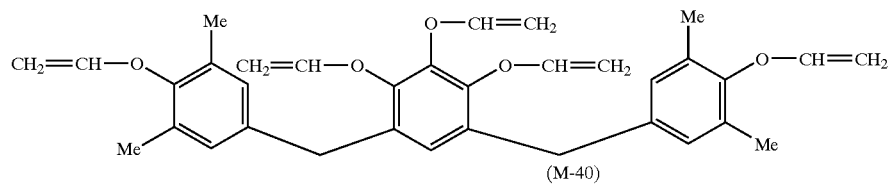
(M-39)

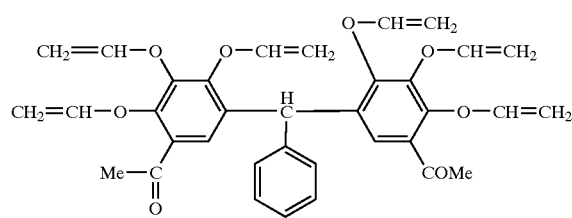
(M-40)

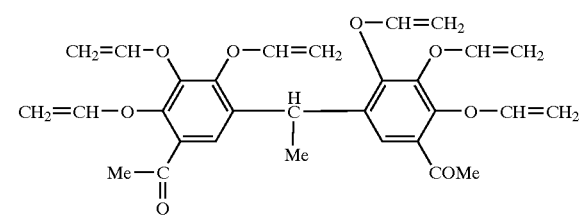
(M-41)

On the other hand, a compound represented by formula (III) (the case where B represents —CO—O—) can be produced by the reaction of a polyvalent carboxylic acid with a halogenated alkyl vinyl ether. The specific examples thereof include diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate, and diethylene vinyl ether itaconate, but the present invention is not limited thereto.

Further, as the compound having a vinyloxy group preferably used in the present invention, a vinyloxy group-containing compound synthesized by the reaction of a vinyloxy compound having active hydrogen represented by the following formula (IV), (V) or (VI) with a compound having an isocyanate group can be exemplified.

$$CH_2=CH-O-R^5-OH \quad (IV)$$

$$CH_2=CH-O-R^5-COOH \quad (V)$$

$$CH_2=CH-O-R^5-NH_2 \quad (VI)$$

wherein $R^5$ represents a straight chain or branched alkylene group having from 1 to 10 carbon atoms. As the compound having an isocyanate group, the compounds described, e.g., in *Kakyo-zai Handbook* (*Crosslinking Agent Handbook*), Taiseisha Co., Ltd. (1981) can be used.

The specific examples of the compounds represented by formula (III) include polyisocyanate type compounds, e.g., triphenylmethane triisocyanate, diphenylmethane diisocyanate, tolylene diisocyanate, a dimer of 2,4-tolylene diisocyanate, naphthalene-1,5-diisocyanate, o-tolylene diisocyanate, polymethylenepolyphenyl isocyanate, and hexamethylene diisocyanate, and polyisocyanate adducts type compounds, e.g., adducts of tolylene diisocyanate and trimethylolpropane, adducts of hexamethylene diisocyanate and water, and adducts of xylylene diisocyanate and trimethylolpropane.

A variety of compounds having vinyloxy groups at terminals can be synthesized by reacting these isocyanate group-containing compounds with compounds containing an active hydrogen-containing vinyloxy group. The examples of the compounds having a vinyloxy group for use in the present invention are shown below, but the present invention is not limited thereto.

(M-42)
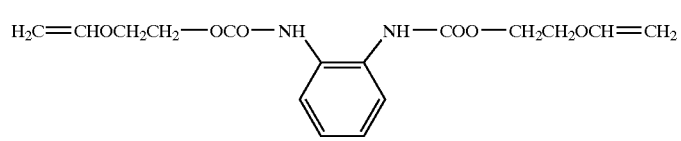
(M-43)
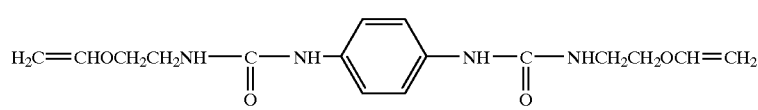
(M-44)
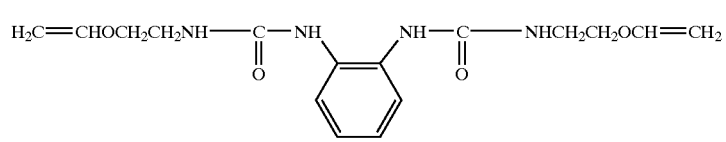
(M-45)
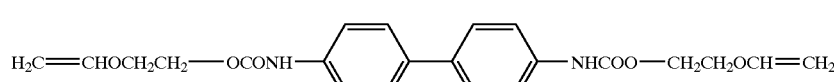
(M-46)
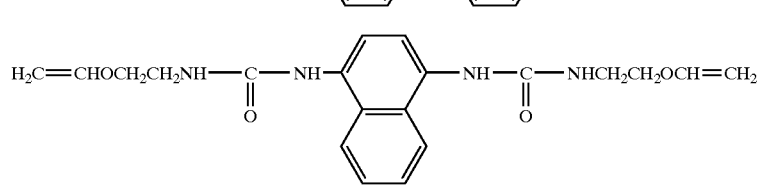
(M-47)
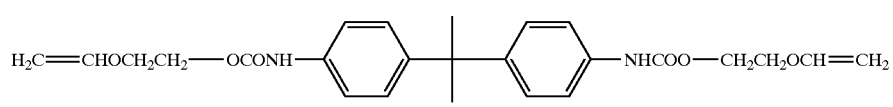
(M-48)
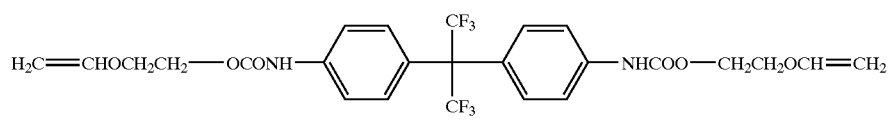
(M-49)
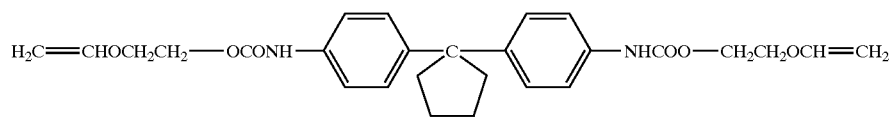
(M-50)
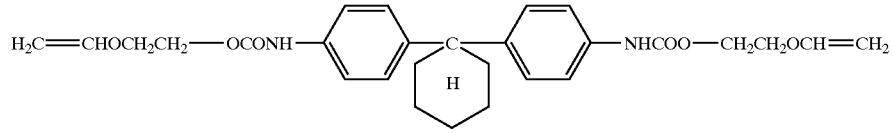
(M-51)
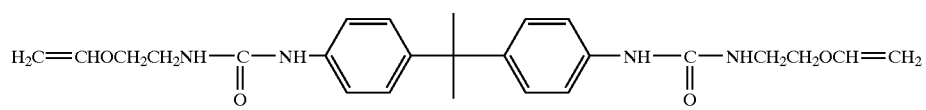
(M-52)
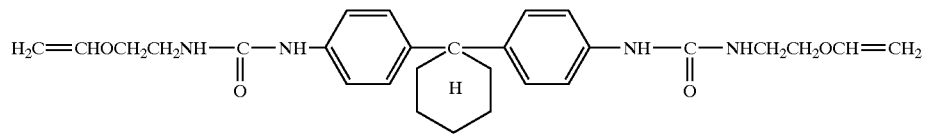
(M-53)
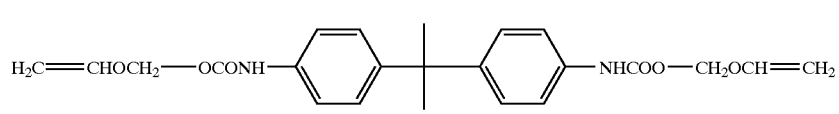
(M-54)

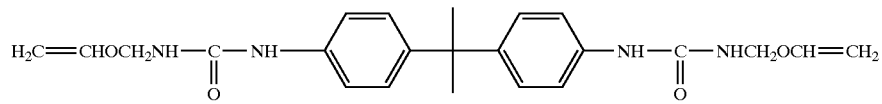
(M-55)
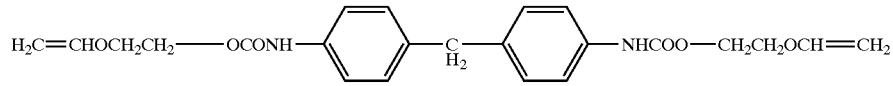
(M-56)
Further, as the compounds having a vinyloxy group preferably used in the present invention, the polymer having a vinyloxy group on the side chain can be exemplified. The specific examples of the polymers are shown below.
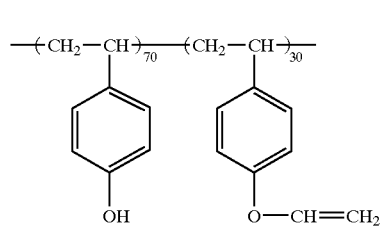
(P-1)
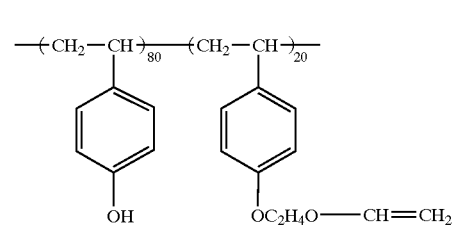
(P-2)
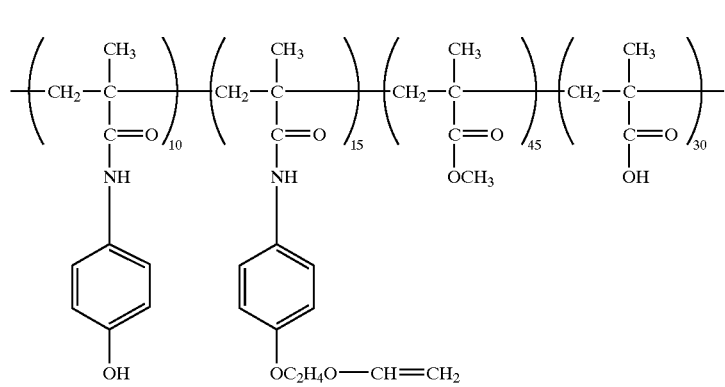
(P-3)
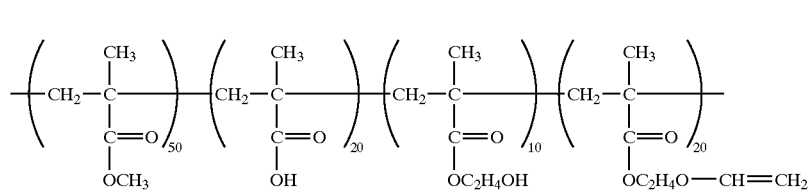
(P-4)
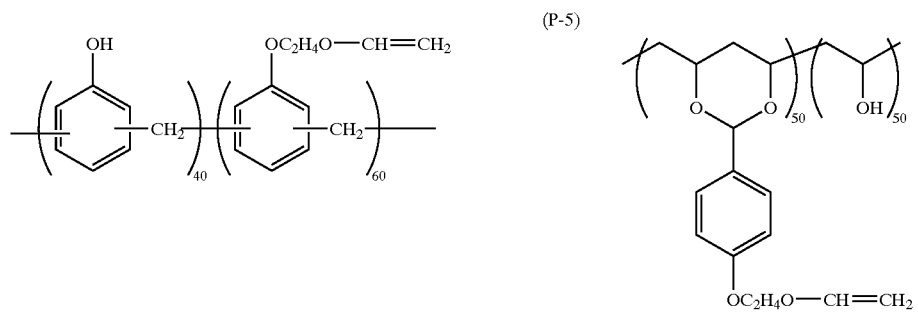
(P-5)
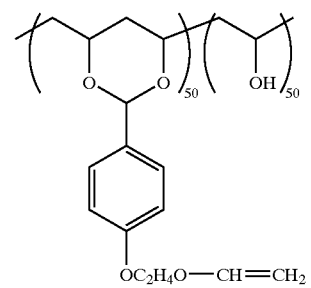
(P-6)

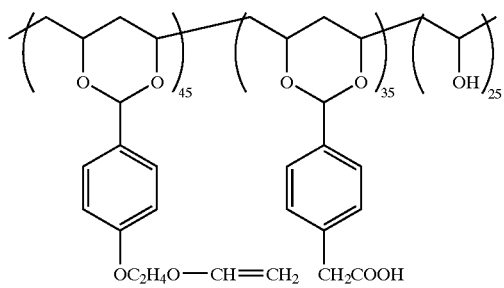
(P-7)

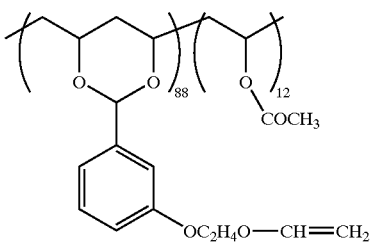
(P-8)

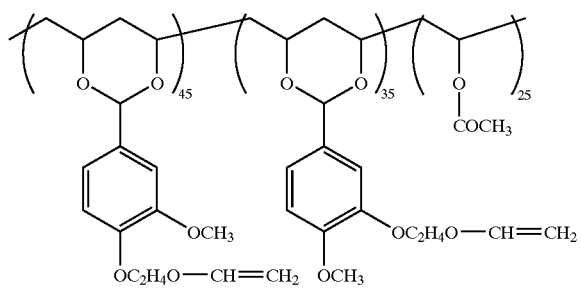
(P-9)

As the compounds having an epoxy group according to the present invention, the compounds having two or more epoxy groups are preferred. When two or more epoxy groups are contained, crosslinking can be carried out effectively, thus the effect of the present invention can be obtained easily.

As the compound having an epoxy group for use in the present invention, the glycidyl ether compounds obtained by the reaction of polyhydric alcohols and polyhydric phenols with epichlorohydrin, the prepolymers thereof, polymers and copolymers of acrylic acid or methacrylic acid glycidyl, etc., can be exemplified.

The specific examples of the preferred compounds having an epoxy group include propylene glycol diglycidyl ether, tripropylene glycol diglycidyl ether, polypropylene glycol diglycidyl ether, neopentyl glycol diglycidyl ether, trimethylolpropane triglycidyl ether, diglycidyl ether of hydrogenated bisphenol A, hydroquinone diglycidyl ether, resorcinol diglycidyl ether, diglycidyl ether of bisphenol A or epichlorohydrin adducts of bisphenol A, diglycidyl ether of bisphenol F or epichlorohydrin adducts of bisphenol F, diglycidyl ether of halogenated bisphenol A or epichlorohydrin adducts of halogenated bisphenol A, diglycidyl ether of biphenyl type bisphenol or epichlorohydrin adducts of biphenyl type bisphenol, glycidyl etherified products of novolak resins, methyl methacrylate/glycidyl methacrylate copolymers, and ethyl methacrylate/glycidyl methacrylate copolymers.

As the commercially available products of these compounds, for example, Epikote 1001 (molecular weight: about 900, epoxy equivalent: from 450 to 500), Epikote 1002 (molecular weight: about 1,600, epoxy equivalent: from 600 to 700), Epikote 1004 (molecular weight: about 1,060, epoxy equivalent: from 875 to 975), Epikote 1007 (molecular weight: about 2,900, epoxy equivalent: 2,000), Epikote 1009 (molecular weight: about 3,750, epoxy equivalent: 3,000), Epikote 1010 (molecular weight: about 5,500, epoxy equivalent: 4,000), Epikote 1100L (epoxy equivalent: 4,000), and Epikote YX31575 (epoxy equivalent: 1,200) (all of which are the products of Yuka Shell Epoxy Co., Ltd.), and Sumiepoxy ESCN-195XHN, ESCN-195XL, ESCN-195XF (manufactured by Sumitomo Chemical Co., Ltd.) can be exemplified.

The thermosetting compound for use in the present invention is a low molecular weight compound containing a thermosetting resin and a hydroxymethyl group or an alkoxymethyl group.

The thermosetting resins preferably used in the present invention include resins having a phenolic skeleton, urea-based resins (e.g., urea resins obtained by resinifying urea or urea derivatives such as methoxymethylurea with aldehydes such as formaldehyde), melamine resins (e.g., melamine resins obtained by resinifying melamine or melamine derivatives with aldehydes such as formaldehyde), alkyd resins, unsaturated polyester resins, and polyurethane resins.

As the resins having a preferred phenolic skeleton, e.g., phenolic resins obtained by resinifying phenol or cresol with aldehydes such as formaldehyde, hydroxystyrene resins, methacrylamide or acrylamide resins having a phenolic skeleton, e.g., N-(p-hydroxyphenyl)methacrylamide, and methacrylate or acrylate resins having a phenolic skeleton, e.g., N-(p-hydroxyphenyl)methacrylate, can be exemplified.

Of these, resins having a phenolic skeleton, melamine resins and urea resins are particularly preferred.

Compounds having a molecular weight of 1,000 or less are preferably used in the present invention as the low molecular weight compound having a hydroxymethyl group or an alkoxymethyl group, and a methoxymethyl group and an ethoxymethyl group are preferably used in the present invention as the alkoxymethyl group.

The specific examples of the low molecular weight compounds having a hydroxymethyl group or an alkoxymethyl group include 2,4,6-tris(ethoxymethyl)phenol, 4-chloro-2,6-bis(ethoxyethyl)phenol, 2,6-bis(hydroxyethyl)-p-toluene, 2,6-bis(ethoxymethyl)-p-toluene, compounds represented by the following formulae (T1) and (T2), and melamine derivatives, e.g., methoxymethylmelamines.

(T-1) R=CH₃    (T-2) R=H

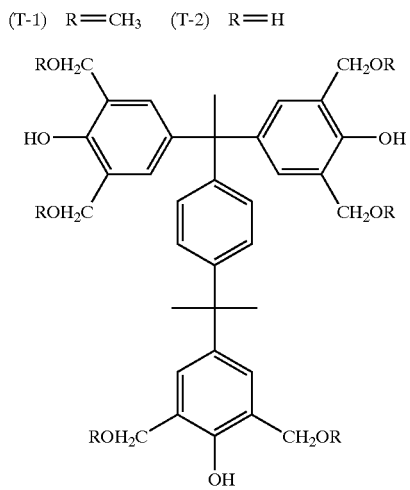

The fine particles containing the above-described compounds having a vinyloxy group or an epoxy group, or the fine particles containing a thermosetting resin can be obtained by a solvent evaporation method comprising the steps of dissolving these compounds or resins alone or as a mixture of two or more in a non-aqueous organic solvent, mixing the resulting solution with an aqueous solution containing a dispersant and emulsifying the solution, and then solidifying the emulsion into fine particles with heating to evaporate the organic solvent, but the present invention is not limited thereto.

The fine particles containing these compounds or resins together with infrared ray-absorbing dyes are also preferably used in the present invention. Further, in the case of the fine particles containing the compounds having a vinyloxy group or an epoxy group, it is also preferred to coexist an acid precursor with these compounds. In the case of the fine particles containing the compounds having a vinyloxy group or an epoxy group, it is also preferred to contain a compound having a functional group which reacts with a vinyloxy group or an epoxy group (the other compound of the reaction) in the fine particles. The coexistence of an infrared ray-absorbing dye, an acid precursor and/or the other compound of the reaction in the fine particles can be performed according to the above solvent evaporation method. That is, the coexistence can be effected by dissolving an infrared ray-absorbing dye, an acid precursor and/or the other compound of the reaction together when the compounds having a vinyloxy group or an epoxy group are dissolved in a non-aqueous organic solvent and performing the solvent evaporation method.

The compound having a vinyloxy group or an epoxy group can be micro-encapsulated by well-known methods. For example, as the manufacturing method of the microcapsules, the method making use of coacervation as disclosed in U.S. Pat. Nos. 2,800,457 and 2,800,458, the interfacial polymerization method as disclosed in British Patent 990,443, U.S. Pat. No. 3,287,154, JP-B-38-19574 (the term "JP-B" as used herein means an "examined Japanese patent publication"), JP-B-42-446, and JP-B-42-711, the method by the deposition of a polymer as disclosed in U.S. Pat. Nos. 3,418,250 and 3,660,304, the method using isocyanate polyol wall materials as disclosed in U.S. Pat. No. 3,796,669, the method using isocyanate wall materials as disclosed in U.S. Pat. No. 3,914,511, the method using urea-formaldehyde series or urea-formaldehyde-resorcinol series wall materials as disclosed in U.S. Pat. Nos. 4,001, 140, 4,087,376 and 4,089,802, the method using wall materials, such as melamine-formaldehyde resins and hydroxy cellulose, as disclosed in U.S. Pat. No. 4,025,445, the monomer polymerization in situ method as disclosed in JP-B-36-9163 and JP-B-51-9079, the spray drying method as disclosed in British Patent 930,422 and U.S. Pat. No. 3,111,407, and the electrolytic dispersion cooling method as disclosed in British Patents 952,807 and 967,074 can be exemplified, but the present invention is not limited thereto.

The microcapsule walls preferably used in the present invention have three dimensional crosslinking and a property of swelling by a solvent. From this point of view, polyurea, polyurethane, polyester, polycarbonate, polyamide, and the mixtures of these compounds are preferably used as the microcapsule wall materials, and polyurea and polyurethane are particularly preferred.

The microcapsule according to the present invention can be synthesized so as to contain a solvent in the dispersion medium for dissolving the contents encapsulated and swelling the wall material. The diffusion of the contents out of the microcapsule is accelerated by the solvent.

Such solvents depend upon the dispersion media of microcapsules, the materials and the wall thicknesses of microcapsule walls, and the contents of microcapsules, but they can be selected easily from many commercially available products. For example, in the case of a microcapsule of aqueous dispersion comprised of crosslinked polyurea or polyurethane wall, alcohols, ethers, acetals, esters, ketones, polyhydric alcohols, amides, amines and fatty acids are preferably used as the solvent.

As the specific examples of the solvents, methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide, and N,N-dmethylacetamide can be exemplified, but the present invention is not limited thereto. These solvents may be used in combination of two or more.

Solvents which are insoluble in microcapsule dispersion solutions but are soluble when the above solvents are mixed can also be used in the present invention. The addition amount of the solvent is decided depending upon the combination of the materials but when it is less than the optimal amount, image-forming property is insufficient, while when it is too much, the stability of the dispersion solution is deteriorated. The addition amount is in general from 5 to 95 wt %, preferably from 10 to 90 wt %, and more preferably from 15 to 85 wt %, based on the coating solution.

The average particle size of the fine particles and microcapsules containing a compound having a vinyloxy group or an epoxy group is preferably from 0.01 to 3.0 μm, more preferably from 0.05 to 2.0 μm, and particularly preferably from 0.08 to 1.0 μm. The average particle size of the fine particles containing a thermosetting compound is preferably from 0.01 to 2.0 μm. Good resolving power and storage stability can be obtained with this range of particle size.

The addition amount of the fine particles and the microcapsules containing a compound having a vinyloxy group or an epoxy group to the image-forming layer is preferably 50 wt % or more, more preferably 60 wt % or more, based on the solid contents of the image-forming layer. The addition amount of the fine particles containing a thermosetting compound to the image-forming layer is preferably from 40 to 98 wt %, more preferably from 50 to 95 wt %, based on the solid contents of the image-forming layer. Good on-press developing property and high press life (i.e., high printing durability) can be obtained with this range of addition amount.

The fine particles containing a compound having a vinyloxy group or an epoxy group according to the present invention can contain a compound having a functional group which reacts with a vinyloxy group or an epoxy group. As the preferred functional groups which react with a vinyloxy group, there can be exemplified a carboxyl group and a hydroxyl group. The compounds having two or more functional groups are preferably used in the present invention. Either low molecular weight compounds or high molecular weight compounds can be used.

The specific examples of such low molecular weight compounds include 1,4-bis(2-hydroxyethyloxy)benzene, 1,3,5-tris(2-hydroxyethyloxy)benzene, bisphenol A, 2,2-bis(4-hydroxymethyloxyphenyl)propane, 2,2-bis[4-(2-hydroxyethyloxy)phenyl]propane, 4,4'-bis(2-hydroxyethyloxy)biphenyl, and 1,1,1-tris(4-hydroxyphenyl)ethane.

As the high molecular weight compounds which react with a vinyloxy group, the polymers and copolymers of monomers having a carboxyl group, e.g., acrylic acid, methacrylic acid, maleic acid, itaconic acid, crotonic acid, isocrotonic acid, p-vinylbenzoic acid, p-vinylcinnamic acid, and maleic acid monomethyl ether, and monomers having a hydroxyl group, e.g., 2-hydroxyethyl acrylate, 2-hydroxyethyl methacrylate, p-hydroxystyrene, halogenated hydroxystyrene, N-(4-hydroxyphenyl)acrylamide, N-(4-hydroxyphenyl)methacrylamide, (4-hydroxyphenyl)acrylate, and (4-hydroxyphenyl)methacrylate can be exemplified.

Further, as the high molecular weight compounds which react with a vinyloxy group, the copolymers with other monomers which are copolymerizable with the above monomers can also be used. As such copolymerizable monomers, e.g., acrylonitrile, acrylamide, methacrylamide, methyl acrylate, ethyl acrylate, propyl acrylate, butyl acrylate, benzyl acrylate, methyl methacrylate, ethyl methacrylate, propyl methacrylate, butyl methacrylate, benzyl methacrylate, vinyl benzoate, vinyl chloride, vinylidene chloride, styrene, vinyl acetate, butadiene, chloroprene, and isoprene can be exemplified, but the present invention is not limited thereto.

As some other high molecular weight compounds which react with a vinyloxy group, linear high molecular weight compounds having a carboxyl group and a hydroxyl group obtained by the co-condensation of dihydroxy compounds having a carboxyl group with dicarboxylic acid compounds can be exemplified. For example, linear polyurethane resins having a carboxyl group obtained by reacting dihydroxy compounds having a carboxyl group such as 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, or tartaric acid with the equivalent amount of diisocyanate compounds such as 2,4-tolylene diisocyanate, dimers of 2,4-tolylene diisocyanate, 4,4'-diphenylmethane diisocyanate, 1,5-naphthylene diisocyanate, hexamethylene diisocyanate, trimethylhexamethylene diisocyanate, 4,4'-methylenebis(cyclohexyl isocyanate), etc., can be exemplified. Further, compounds using diol compounds which do not have a carboxyl group and may have some other substituents which do not react with isocyanate, e.g., ethylene glycol, diethylene glycol, triethylene glycol, neopentyl glycol, 1,3-butylene glycol, bisphenol A, hydrogenated bisphenol A, hydrogenated bisphenol F, ethylene oxide adducts of bisphenol A, etc., in combination may also be used.

As still other high molecular weight compounds which react with a vinyloxy group, diols having the above carboxyl group and, if necessary, polyesters having a carboxyl group obtained by the co-condensation of the above other diols with a bifunctional carboxylic acid, e.g., phthalic acid, isophthalic acid, terephthalic acid, fumaric acid, itaconic acid, adipic acid, etc., can be exemplified.

As the preferred functional groups which react with an epoxy group, there can be exemplified a carboxyl group and an aromatic hydroxyl group. The compounds having two or more these functional groups are preferably used in the present invention. Either low molecular weight compounds or high molecular weight compounds can be used.

The specific examples of such low molecular weight compounds include bisphenol A, 4,4'-dihydroxybiphenyl, and 1,1,1-tris(4-hydroxyphenyl)ethane.

As the high molecular weight compounds which react with an epoxy group, the polymers and copolymers of monomers having a carboxyl group, e.g., acrylic acid, methacrylic acid, maleic acid, itaconic acid, crotonic acid, isocrotonic acid, p-vinylbenzoic acid, p-vinylcinnamic acid, and maleic acid monomethyl ether, and monomers having a hydroxyl group, e.g. p-hydroxystyrene, halogenated hydroxystyrene, N-(4-hydroxyphenyl)acrylamide, N-(4-hydroxyphenyl)methacrylamide, (4-hydroxyphenyl)acrylate, and (4-hydroxyphenyl)methacrylate can be exemplified.

Further, as the high molecular weight compounds which react with an epoxy group, the copolymers with other monomers which are copolymerizable with the above monomers can also be used. As such copolymerizable monomers, e.g., acrylonitrile, acrylamide, methacrylamide, methyl acrylate, ethyl acrylate, propyl acrylate, butyl acrylate, benzyl acrylate, methyl methacrylate, ethyl methacrylate, propyl methacrylate, butyl methacrylate, benzylmethacrylate, vinylbenzoate, vinyl chloride, vinylidene chloride, styrene, vinyl acetate, butadiene, chloroprene, and isoprene can be exemplified, but the present invention is not limited thereto.

As some other high molecular weight compounds which react with an epoxy group, linear high molecular weight compounds having a carboxyl group and a hydroxyl group obtained by the co-condensation of dihydroxy compounds having a carboxyl group with dicarboxylic acid compounds can be exemplified. For example, linear polyurethane resins having a carboxyl group obtained by reacting dihydroxy compounds having a carboxyl group such as 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, or tartaric acid with the equivalent amount of diisocyanate compounds such as 2,4-tolylene diisocyanate, dimers of 2,4-tolylene diisocyanate, 4,4'-diphenylmethane diisocyanate, 1,5-naphthylene diisocyanate, hexamethylene diisocyanate, trimethylhexamethylene diisocyanate, 4,4'-methylenebis(cyclohexyl isocyanate), etc., can be exemplified. Further, compounds using diol compounds which do not have a carboxyl group and may have some other substituents which do not react with isocyanate, e.g., ethylene glycol, diethylene glycol, triethylene glycol, neopentyl glycol, 1,3-butylene glycol, bisphenol A, hydrogenated bisphenol A, hydrogenated bisphenol F, ethylene oxide adducts of bisphenol A, etc., in combination may also be used.

As still other high molecular weight compounds which react with an epoxy group, diols having the above carboxyl group and, if necessary, polyesters having a carboxyl group obtained by the co-condensation of the above other diols with a bifunctional carboxylic acid, e.g., phthalic acid, isophthalic acid, terephthalic acid, fumaric acid, itaconic acid, adipic acid, etc., can be exemplified.

As other compounds which react with a vinyloxy group or an epoxy group, phenol resins such as novolak resins, e.g., phenol-formaldehyde resins, m-cresol-formaldehyde resins, p-cresol-formaldehyde resins, o-cresol-formaldehyde resins, m-/p-mixed cresol-formaldehyde resins, and phenol-cresol-formaldehyde resins, resol type phenol resins, and phenol-modified xylene resins can be exemplified.

The microcapsules encapsulating a compound having a vinyloxy group or an epoxy group according to the present invention can encapsulate a compound having a functional group which reacts with a vinyloxy group or an epoxy group. As the preferred functional group which can be encapsulated in the microcapsules is a hydroxyl group, and the above-described compounds having a hydroxyl group can be preferably used.

The addition amount of the compound having a functional group which reacts with a vinyloxy group or an epoxy group is preferably from 1 to 95 wt %, more preferably from 20 to 90 wt %, and most preferably from 30 to 80 wt %, based on the solid contents of the fine particles or microcapsules containing a compound having a vinyloxy group or an epoxy group.

The image-forming layer according to the present invention contains a hydrophilic resin for the purpose of enhancing the on-press developing property and the film strength of the image-forming layer itself. As the hydrophilic resins, e.g., resins having a film-forming property having a hydrophilic group such as a hydroxyl group, a carboxyl group, a phosphoric acid group, a sulfonic acid group, or an amido group are preferably used. Further, when a hydrophilic resin is reacted with a vinyloxy group or an epoxy group and crosslinked, the image strength is increased and the press life is improved, hence hydrophilic resins having functional groups which react with these groups are preferred. Above all, if the compound having a vinyloxy group is used, a hydrophilic resin having a hydroxyl group or a carboxyl group is preferred, and if the compound having an epoxy group is used, a hydrophilic resin having a carboxyl group is preferred.

The specific examples of hydrophilic resins include gum arabic, casein, gelatin, starch derivatives, soybean glue, hydroxypropyl cellulose, methyl cellulose, carboxymethyl cellulose and sodium salts thereof, cellulose acetate, sodium alginate, vinyl acetate-maleic acid copolymers, styrene-maleic acid copolymers, polyacrylic acids and the salts thereof, polymethacrylic acids and the salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having the degree of hydrolysis of 60 wt % and preferably at least 80 wt %, polyvinyl formal, polyvinyl pyrrolidone, homopolymers and copolymers of acrylamide, homopolymers and copolymers of methacrylamide, homopolymers and copolymers of N-methylolacrylamide, homopolymers and copolymers of 2-acrylamide-2-methyl-1-propanesulfonic acid, and homopolymers and copolymers of 2-methacryloyloxyethylsulfonic acid.

Moreover, the above-described hydrophilic resin may be crosslinked to such a degree that the unexposed domain may be developed on a printing machine. As the crosslinking agents, aldehyde resins, e.g., glyoxal, melamine-formaldehyde resins, and urea-formaldehyde resins, methylol compounds, e.g., N-methylolurea, N-methylolmelamine, and methylolated polyamide resins, active vinyl compounds, e.g., divinylsulfone and (β-hydroxyethylsulfonic acid), epoxy compounds, e.g., epichlorohydrin, polyethylene glycol diglycidyl ether, polyamide, polyamine, epichlorohydrin adducts, and polyamide-epichlorohydrin resins, ester compounds, e.g., monochloroacetic acid ester and thioglycolic acid ester, polycarboxylic acids, e.g., polyacrylic acid and methyl vinyl ether-maleic acid copolymer, inorganic crosslinking agents, e.g., boric acid, titanyl sulfate, Cu, Al, Sn, V, Cr salts, and modified polyamideimide resins can be exemplified.

In addition, such crosslinking agents as ammonium chloride, a silane coupling agent, a titanate coupling agent can be used in combination.

The acid precursor for use in the image-forming layer in the present invention generates an acid at exposure and initiates or accelerates the reaction of a compound having a vinyloxy group or an epoxy group. Although the acid precursor may be contained in the hydrophilic resin of the image-forming layer, it is preferred that the acid precursor be contained in the fine particles containing a compound having a vinyloxy group or an epoxy group or the microcapsules containing a compound having a vinyloxy group or an epoxy group from the point of capable of easily obtaining high sensitivity and high press life.

As the acid precursors for use in the present invention, photo-initiators of photo-cationic polymerization, photo-initiators of photo-radical polymerization, photo-decolorants of dyes, photo-discolorants, well-known acid-generating agents for use in microresists, etc., well-known acid-generating compounds by thermal decomposition, and mixtures of these compounds can be arbitrarily selected.

As the acid precursors preferably used in a compound having a vinyloxy group, onium salts such as the diazonium salts described in S. I. Schlesinger, *Photogr. Sci. Eng.*, 18, 387 (1974), and T. S. Bal et al., *Polymer,* 21, 423 (1980), the ammonium salts disclosed in U.S. Pat. Nos. 4,069,055, 4,069,056, Re 27,992, and JP-A-4-365049, the phosphonium salts described in D. C. Necker et al., *Macromolecules,* 17, 2468 (1984), C. S. Wen et al., *Teh, Proc. Conf. Rad. Curing ASIA*, p. 478, Tokyo, October (1988), U.S. Pat. Nos. 4,069,055 and 4,069,056, the iodonium salts described in J. V. Crivello et al., *Macromolecules,* 10 (6), 1307 (1977), *Chem. & Eng. News*, November 28, p. 31 (1988), EP104143, JP-A-2-150848, and JP-A-2-296514, the sulfonium salts described in J. V. Crivello et al., *Polymer J.,* 17, 73 (1985), J. V. Crivello et al., *J. Org. Chem.,* 43, 3055 (1978), W. R. Watt et al., *J. Polymer Sci.,* Polymer Chem. Ed., 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci.*, Polymer Chem. Ed., 17, 2877 (1979), EP 370693, U.S. Pat. No. 3,902,114, EP 233567, EP 297443, EP 297442, U.S. Pat. No. 4,933,377, U.S. Pat. Nos. 4,760,013, 4,734,444, 2,833,827, German Patents 2,904,626, 3,604,580, and 3,604,581, the selenonium salts described in J. V. Crivello et al., *Macromolecules,* 10 (6), 1307 (1977), and J. V. Crivello et al., *J. Polymer Sci.,* Polymer Chem. Ed., 17, 1047 (1979), the arsonium salt, etc., described in C. S. Wen et al., *Teh, Proc. Conf. Rad. Curing ASIA,* p. 478, Tokyo, October (1988); the organic halide compounds disclosed in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organic metal/organic halide compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896) and JP-A-2-161445; the light/acid generating agents having o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EP 0290750, EP 046083, EP 156535, EP 271851, EP 0388343, U.S. Pat. Nos. 3,901,710, 4,181,531, JP-A-60-198538, and JP-A-53-133022; the compounds which generate a sulfonic acid by photolysis represented by iminosulfonate described in M. Tunook et al., *Polymer Preprints, Japan*, 38 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EP 0199672, EP 84515, EP 199672, EP 044115, EP 0101122, U.S. Pat. Nos. 4,618,564, 4,371,605, 4,431,774, JP-A-64-18143, JP-A-2-245756, and JP-A-4-365048; and the disulfone compounds disclosed in JP-A-61-166544 can be exemplified.

Further, the compounds having introduced these acid-generating groups or compounds into the polymer main chains or side chains as described, e.g., in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-1460387, JP-A-63-163452, JP-A-62-153853, and JP-A-63-146029 can be used in the present invention.

Further, the compounds which generate acids by light, e.g., described in V. N. R. Pillai, *Synthesis*, (1), 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and EP 12712 can also be used. More specifically, the following compounds can be exemplified.

(A1-1)

(A1-2)

(A1-3)

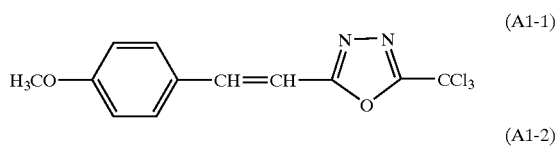

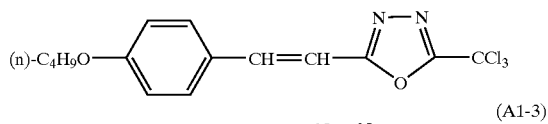

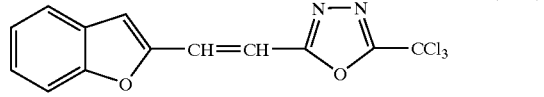

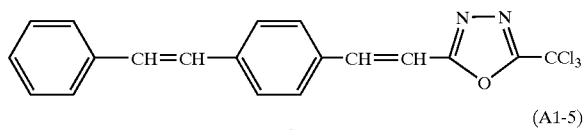
(A1-4)

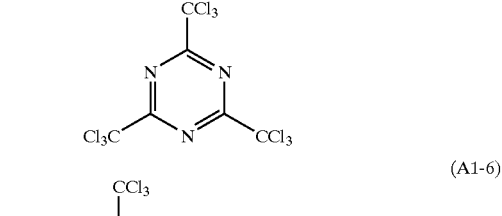
(A1-5)

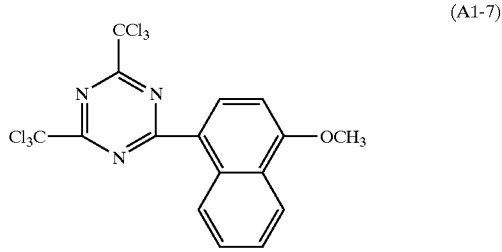
(A1-6)

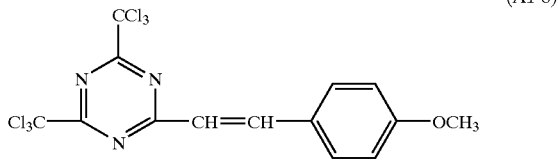
(A1-7)

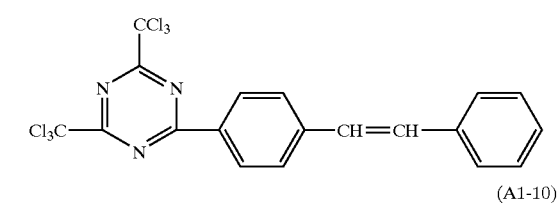
(A1-8)

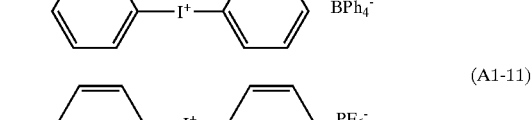
(A1-9)

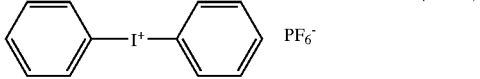
(A1-10)

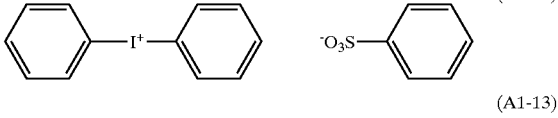
(A1-11)

(A1-12)

(A1-13)

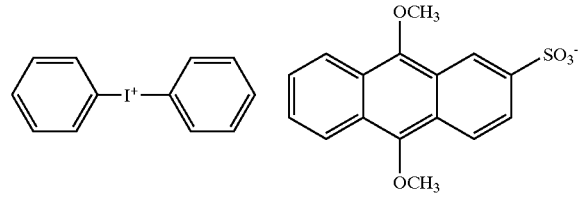

-continued

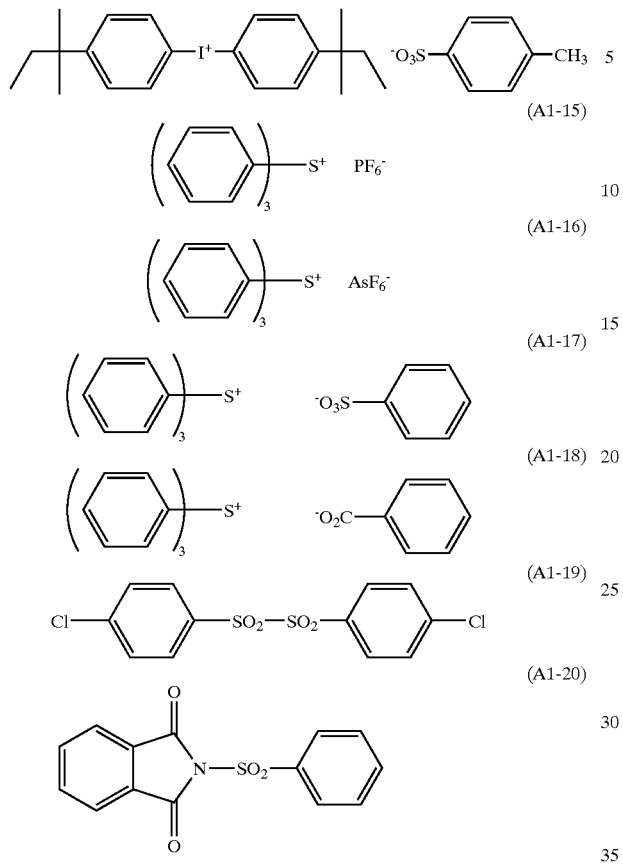

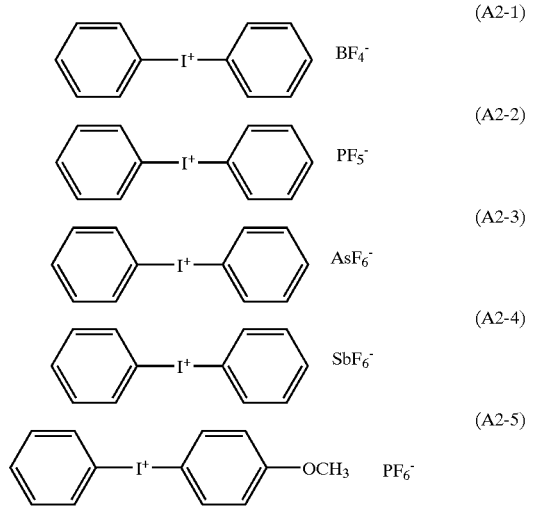

When a compound having an epoxy group is used, onium salts, such as a diazonium salt, an ammonium salt, a phosphonium salt, an iodonium salt, a sulfonium salt, a selenonium salt and an arsonium salt of the above-described acid precursors are preferably used and, above all, onium salts having counter anions of oniums of $BF_4^-$, $PF_6^-$, $AsF_6^-$, $SbF_6^-$, etc., are more preferred. The specific examples of the onium salts are shown below, but the present invention is not limited thereto.

-continued

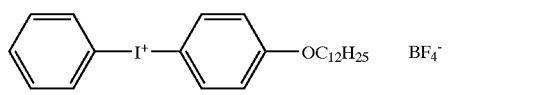

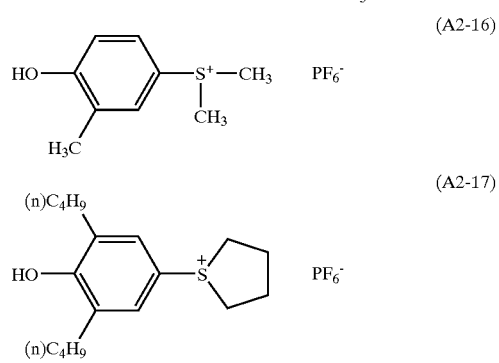

-continued

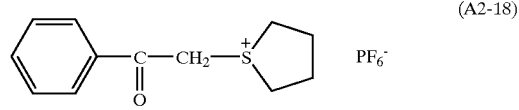
(A2-18)

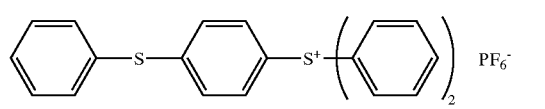
(A2-19)

The addition amount of the acid precursors is preferably from 0.01 to 20 wt %, more preferably from 0.1 to 10 wt %, based on the total solid contents of the image-forming layer.

The image-forming layer of the present invention can contain an infrared ray-absorbing dye for the purpose of increasing the infrared absorbing efficiency to enhance sensitivity. Although the infrared ray-absorbing dye may be contained in the hydrophilic resin of the image-forming layer, it is preferred that the dye be contained in the fine particles or the microcapsules from the point of capable of easily obtaining high sensitivity and high press life.

Such infrared ray-absorbing dyes may be sufficient so long as they are light-absorbing substances having absorption band at least in apart of the wavelength of from 700 to 1,200 nm, and various kinds of pigments, dyes and metal particles can be used.

As such pigments, commercially available pigments and infrared ray-absorbing pigments described in *Color Index* (*C.I.*) *Binran* (*Color Index Handbook*), *Saishin Ganryo Binran* (*The Latest Pigment Handbook*), compiled by Nihon Ganryo Gijutsu Kyokai (1977), *Saishin Ganryo Oyo Gijutsu* (*The Latest Pigment Applied Technique*), published by CMC Publishing Co. (1986), *Insatsu Ink Gijutsu* (*Printing Ink Technique*), CMC Publishing Co. (1984) can be used.

These pigments may be surface-treated by well-known surface treatment methods, if necessary, for improving the dispersibility in the layer to be added. As methods of surface treatments, a method of surface-coating with hydrophilic resins and lipophilic resins, a method of adhering surfactants, and a method of attaching reactive substances (e.g., silica sol, alumina sol, silane coupling agents, epoxy compounds, isocyanate compounds, etc.) on the surfaces of pigments can be exemplified.

The pigments to be added to a hydrophilic layer are preferably surface-coated with hydrophilic resins or silica sol so as to be dispersed with water-soluble resins and not to impair the hydrophilic property. The particle size of the pigments is preferably from 0.01 to 1 µm, more preferably from 0.01 to 0.5 µm. Well-known dispersing methods used in manufacturing inks and toners can be used as dispersing methods of pigments.

Carbon black can be exemplified as a particularly preferred pigment.

As the dyes for this purpose, commercially available dyes and well-known dyes described, for example, in *Senryo Binran* (*Dye Handbook*), compiled by Yuki Gosei Kagaku Kyokai (1970), "Kin-Sekigai Kyushu Shikiso (Near Infrared Ray Absorbing Dyes)" in *Kagaku Kogyo* (*Chemical Industry*), pp. 45 to 51 (May, 1986), 90 *Nen-dai Kinosei Shikiso no Kaihatsu to Shijo Doko* (*Development and Market Trend of Functional Dyes in the Nineties*), Item 2.3, Chapter 2, CMC Publishing Co. Ltd. (1990), or various patent specifications can be utilized. Specifically, infrared ray-absorbing dyes, e.g., azo dyes, metal complex azo dyes, pyrazolone azo dyes, anthraquinone dyes, phthalocyanine dyes, carbonium dyes, quinoneimine dyes, polymethine dyes, and cyanine dyes are preferably used.

Further, as infrared ray-absorbing dyes, e.g., the cyanine dyes disclosed in JP-A-58-125246, JP-A-59-84356, and JP-A-60-78787, the methine dyes disclosed in JP-A-58-173696, JP-A-58-181690, and JP-A-58-194595, the naphthoquinone dyes disclosed in JP-A-58-112793, JP-A-58-224793, JP-A-59-48187, JP-A-59-73996, JP-A-60-52940, and JP-A-60-63744, the squarylium dyes disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, the dyes disclosed in JP-A-10-268512, and the phthalocyanine compounds disclosed in JP-A-11-235883 can be exemplified.

Further, the near infrared ray-absorbing sensitizing dyes disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in JP-A-57-142645, the pyrylium-based compounds disclosed in JP-A-58-181051, JP-A-58-220143, JP-A-59-41363, JP-A-59-84248, JP-A-59-84249, JP-A-59-146063, and JP-A-59-146061, the cyanine dyes disclosed in JP-A-59-216146, the pentamethine thiopyrylium salts disclosed in U.S. Pat. No. 4,283,475, the pyrylium compounds disclosed in JP-B-5-13514 and JP-B-5-19702, Epolite III-178, Epolite III-130, and Epolite III-125 (manufactured by Epoline Co., Ltd.) are also preferably used.

Of these dyes, the dyes which are preferably used in the hydrophilic matrix such as the hydrophilic resin of the image-forming layer are water-soluble dyes and specific examples are shown below.

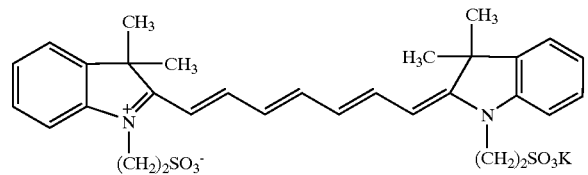
(IR-1)

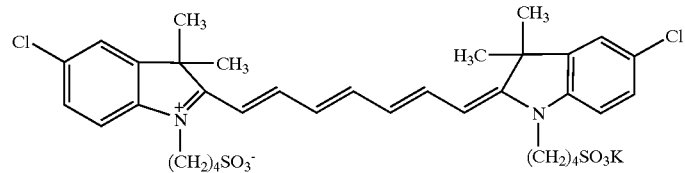
(IR-2)

-continued
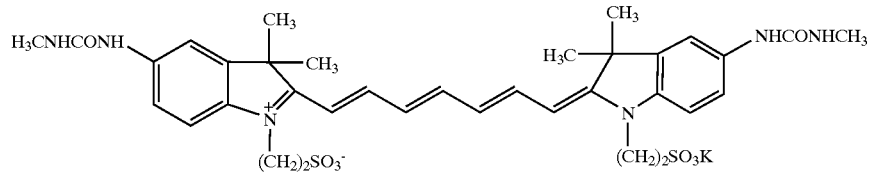
(IR-3)
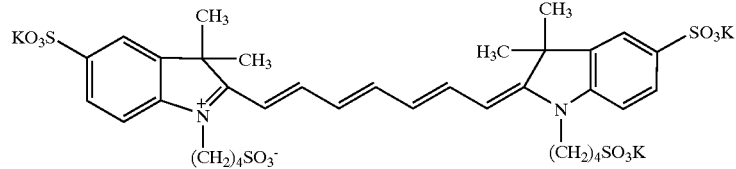
(IR-4)
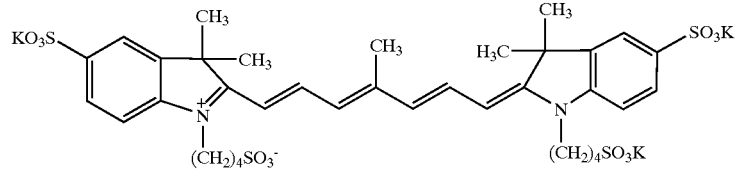
(IR-5)
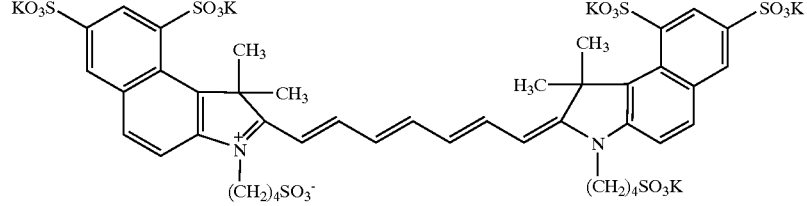
(IR-6)
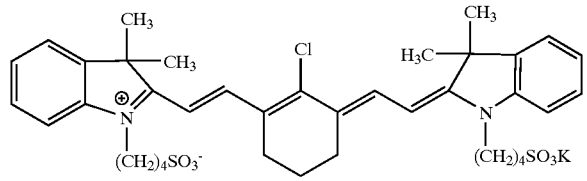
(IR-7)
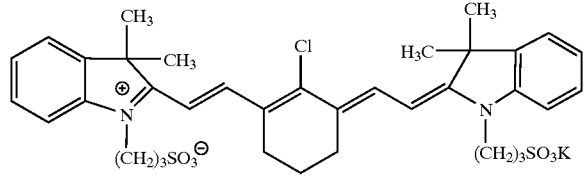
(IR-8)
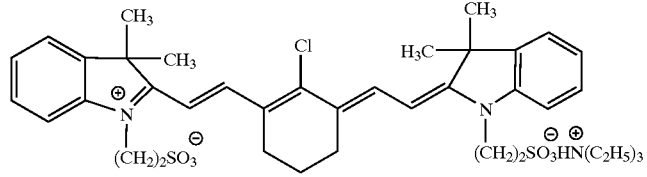
(IR-9)
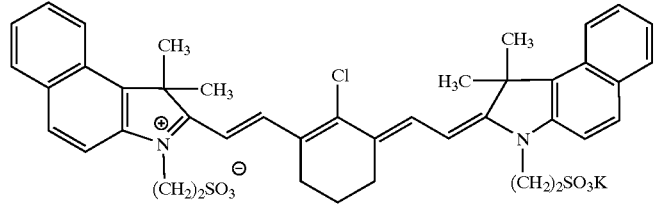
(IR-10)

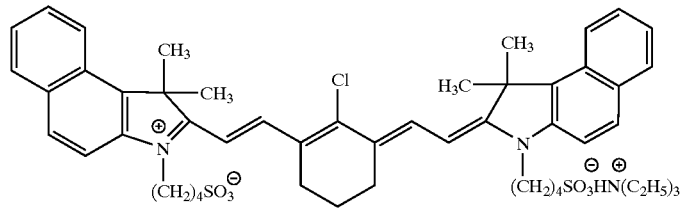
(IR-11)
As the infrared ray-absorbing dyes added into the hydrophobic compounds in the fine particles and the microcapsules in the image-forming layer in the present invention, the above infrared ray-absorbing dyes may be used but lipophilic dyes are more preferred. The following dyes can be exemplified as the specific examples.
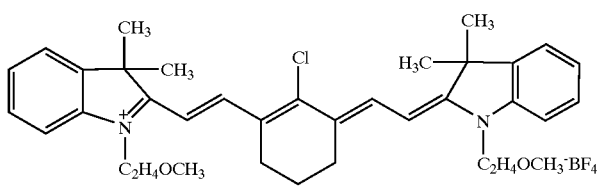
(IR-21)
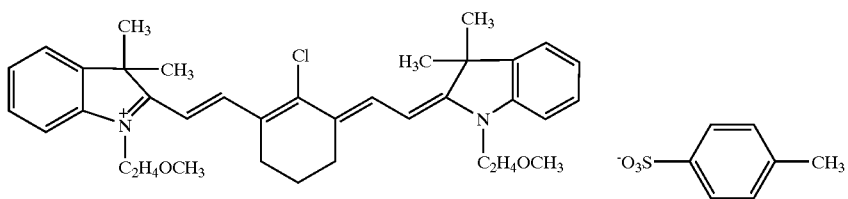
(IR-22)
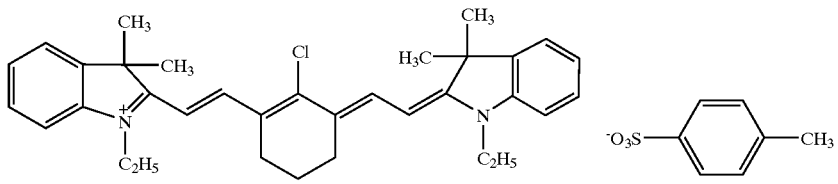
(IR-23)
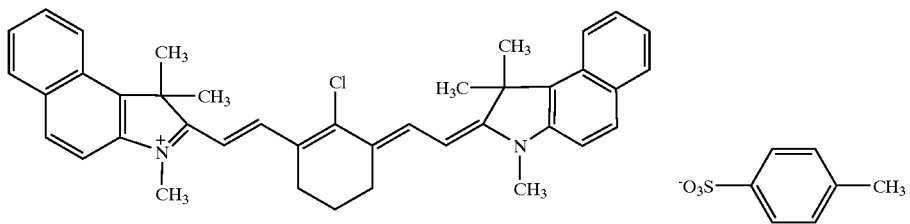
(IR-24)
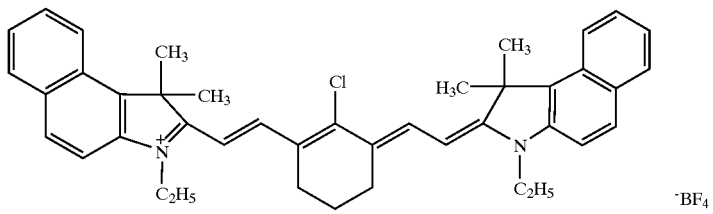
(IR-25)

-continued

M = VO, R = i-C$_5$H$_{11}$ (IR-26)

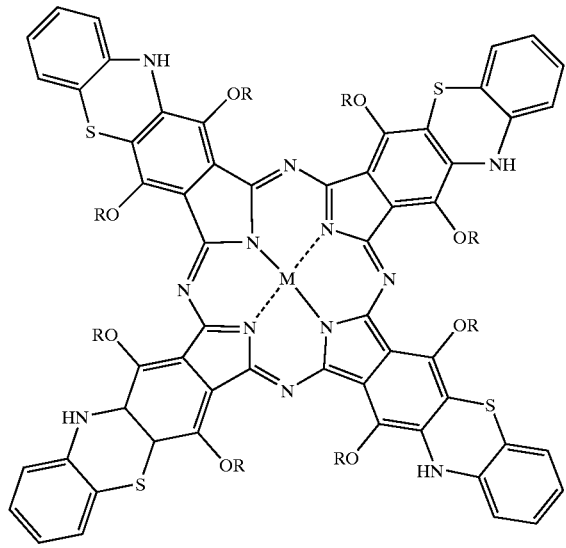

(IR-27)

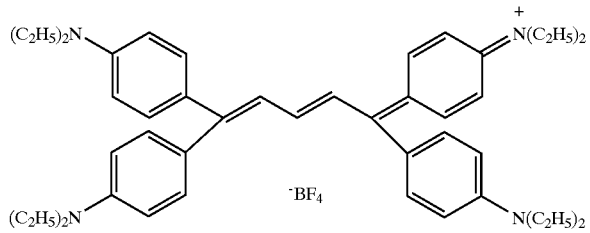

The above-described organic infrared ray-absorbing dyes can be added to the image-forming layer in an amount of up to 30 wt %, preferably from 5 to 25 wt %, and particularly preferably from 6 to 20 wt %. Good sensitivity can be obtained with this range of addition amount.

The image-forming layer of the present invention can also contain metallic fine particles as the infrared ray-absorbing dyes. Many metallic fine particles are light-to-heat convertible and also self-exothermic at the same time.

Examples of preferred metallic fine particles include the fine particles of simple substances or alloys of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb, etc., or oxides or sulfides of them.

The preferred metals among the metals constituting these metallic fine particles are metals having a melting point of about 1,000° C. or less at which they are easily fused by light irradiation and having absorption in the infrared, visible or ultraviolet region, e.g., Re, Sb, Te, Au, Ag, Cu, Ge, Pb and Sn.

Further, metallic fine particles having a relatively low melting point and comparatively high heat absorbance, e.g., Ag, Au, Cu, Sb, Ge and Pb, are especially preferred, and most preferred elements are Ag, Au and Cu.

Moreover, the metallic fine particles may be comprised of two or more light-to-heat converting substances by mixing fine particles of metals having a low melting point, e.g., Re, Sb, Te, Au, Ag, Cu, Ge, Pb and Sn, and fine particles of self-exothermic metals, e.g., Ti, Cr, Fe, Co, Ni, W and Ge. It is also preferred to use metallic fine pieces by combining fine pieces of metals showing large light absorption especially in the form of pieces, e.g., Ag, Pt and Pd, with other metallic fine pieces.

The fine particles of the above-described simple substances of metals or metal alloys can exhibit the effect of the present invention by undergoing surface hydrophilizing treatment. As the means of the surface hydrophilizing treatment, a method of surface treatment with a compound which is hydrophilic and adsorptive to particles, e.g., a surfactant; a method of surface treatment with a substance having a hydrophilic group reactive with the constitutional substances of the particles; and a method of providing a hydrophilic high polymer having a protective colloidal property can be used in the present invention. An especially preferred method is a surface treatment method with silicate. For example, in the case where the fine particles are iron fine particles, the surfaces of the particles can be sufficiently hydrophilized by immersing the particles in a 3% aqueous solution of sodium silicate at 70° C. for 30 seconds. The surface silicate treatment of other metallic fine particles can be effected by the similar methods.

The particle size of these fine particles is preferably 10 μm or less, more preferably from 0.003 to 5 μm, and particularly preferably from 0.01 to 3 μm. Good sensitivity can be obtained with this range of particle size.

When these metallic fine particles are used as infrared ray-absorbing dyes in the present invention, the addition amount is preferably 10 wt % or more, more preferably 20 wt % or more, and particularly preferably 30 wt % or more, based on the solid contents of the image-forming layer. High sensitivity can be obtained with this range of the addition amount.

In the image-forming layer according to the present invention, the dye having large absorption in the visible light region can be used as the colorant of the image for increasing the discriminability of the image domain and the non-image domain after image formation. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, dyes disclosed in JP-A-62-293247 are particularly preferably used. Further, pigments such as phthalocyanine pigments, azo pigments and titanium oxides can also be preferably used. The addition amount is preferably from 0.01 to 10 wt % based on the total solid contents of the image-forming layer coating solution.

Moreover, plasticizers can be added to the image-forming layer for improving the flexibility of the coating film, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofuzfuryl oleate can be used.

The above-described each component of the image-forming layer according to the present invention is dissolved or dispersed in a solvent to prepare a coating solution and coated on a support. Examples of solvents used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, etc., but solvents are not limited thereto. These solvents are used alone or as mixture. The concentration of the solid contents of the coating solution is preferably from 1 to 50 wt %.

The coating amount of the image-forming layer on the support obtained after coating and drying (solid contents) is varied according to purposes, but it is generally preferably from 0.5 to 5.0 g/m$^2$. Various coating methods can be used, e.g., bar coating, rotary coating, spray coating, curtain coating, dip coating, air knife coating, blade coating, and roll coating can be used.

Surfactants, e.g., the fluorine surfactants disclosed in JP-A-62-170950, can be added to the coating solution of the image-forming layer in the present invention with a view to improving the coating property. Addition amount of surfactants is preferably from 0.01 to 1 wt %, more preferably from 0.05 to 0.5 wt %, based on the entire solid contents of the image-forming layer.

Overcoat Layer

A water-soluble overcoat layer may be provided on the image-forming layer of the lithographic printing plate precursor of the present invention for preventing the image-forming layer surface from being stained with lipophilic substances. The water-soluble overcoat layer for use in the present invention can be easily removed at printing and contains a resin selected from water-soluble organic high molecular weight compounds. The water-soluble organic high molecular weight compounds should have film-forming property by coating and drying. The specific examples of the water-soluble organic high molecular compounds include polyvinyl acetate (having hydrolysis rate of 65% or more), polyacrylic acid and alkali metal salts or amine salts of the same, polyacrylic acid copolymers and alkali metal salts or amine salts of the same, polymethacrylic acid and alkali metal salts or amine salts of the same, polymethacrylic acid copolymers and alkali metal salts or amine salts of the same, polyacrylamide and copolymers of the same, polyhydroxyethyl acrylate, polyvinyl pyrrolidone and copolymers of the same, polyvinyl methyl ether, vinyl methyl ether/maleic anhydride copolymers, poly-2-acrylamide-2-methyl-1-propanesulfonic acid and alkali metal salts or amine salts of the same, poly-2-acrylamide-2-methyl-1-propanesulfonic acid copolymers and alkali metal salts or amine salts of the same, gum arabic, cellulose derivatives (e.g., carboxymethyl cellulose, carboxyethyl cellulose, methyl cellulose, etc.) and modified products of the same, white dextrin, plluran, and enzyme-decomposed etherified dextrin. These resins may be used as mixture of two or more kinds according to purposes.

In addition, the overcoat layer may contain the above-described water-soluble infrared ray-absorbing dyes. Further, the overcoat layer may contain nonionic surfactants, e.g., polyoxyethylene nonylphenyl ether and polyoxyethylene dodecyl ether for the purpose of ensuring coating uniformity when the aqueous solution is coated.

The dry coating amount of the overcoat layer is preferably from 0.1 to 2.0 g/m$^2$. The on-press developing property is not impaired and staining of the image-forming layer surface with lipophilic substances such as the adhesion of finger prints is prevented with this range of the dry coating amount.

Support

The supports of the lithographic printing plate precursor of the present invention on which are the above-described image-forming layer can be coated are plate-like materials having dimensional stability. For example, paper, paper laminated with plastics (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper and plastic films laminated or deposited with the above metals can be exemplified as the materials of the support. Preferred support is a polyester film or an aluminum plate.

The aluminum plates are a pure aluminum plate and an aluminum alloy plate comprising aluminum as a main component and a trace amount of foreign elements, or an aluminum or aluminum alloy plate laminated with plastics may also be used. Different elements which may be contained in aluminum alloy are silicon, iron, manganese, copper, magnesium, chromium, zinc, bismuth, nickel, titanium, etc. The content of foreign elements in the aluminum alloy is about 10% by weight or less. (Hereinafter, aluminum and aluminum alloy are generally referred to as "aluminum" and the sheets or plates of the same are referred to as "aluminum sheets".) Further, an aluminum plate may be produced from an aluminum ingot by DC casting or an aluminum ingot by continuous casting. Well-known aluminum plates so far been used can be arbitrarily used in the present invention.

The above-described supports for use in the present invention have a thickness of from 0.05 to 0.6 mm, preferably from 0.1 to 0.4 mm, and particularly preferably from 0.15 to 0.3 mm.

It is preferred to subject an aluminum plate to surface roughening and surface treatment such as anodization before use. By the surface treatment, a hydrophilic property is improved and the adhesion with the image-forming layer can be improved.

The surface-roughening treatment of the surface of an aluminum plate can be performed by various methods, e.g., mechanical surface-roughening treatment, electrochemical roughening by dissolving the surface, and chemical roughening by selectively dissolving the surface. As mechanical roughening, well-known methods, e.g., a ball rubbing method, a brush abrading method, a blasting method, or a buffing method, can be used. As chemical roughening, a method of roughening the surface by immersing an aluminum plate in a saturated aqueous solution of the aluminum salt of a mineral acid as disclosed in JP-A-54-31187 is suitable. As electrochemical roughening, a method of surface-roughening in an electrolyte containing an acid such as a hydrochloric acid or a nitric acid by alternating current or direct current can be used. Further, electrolytic surface roughening using mixed acids can be used as disclosed in JP-A-54-63902.

These surface roughening treatments are preferably performed so that the center line average surface roughness (Ra) of the surface of an aluminum plate becomes from 0.2 to 1.0 μm.

The thus surface-roughened aluminum plate is, if required, subjected to alkali etching treatment with an aqueous solution of potassium hydroxide or sodium hydroxide and neutralizing treatment and then to anodizing treatment to increase the abrasion resistance of the surface.

Various electrolytes for forming porous oxide film can be used in the anodizing treatment of an aluminum plate and, in general, sulfuric acid, hydrochloric acid, oxalic acid, chromic acid and mixed acids of these are used. The concentration of these electrolytes are arbitrarily determined according to the kinds of electrolytes.

Anodizing treatment conditions vary according to electrolytes used but in general the appropriate concentration of electrolyte is from 1 to 80 wt % solution, the liquid temperature is from 5 to 70° C., the electric current density is from 5 to 60 A/dm$^2$, the voltage is from 1 to 100 V, electrolytic time is from 10 seconds to 5 minutes.

The amount of the oxide film formed is preferably from 1.0 to 5.0 g/m$^2$, particularly preferably from 1.5 to 4.0 g/m$^2$.

The support surface-treated and having an anodic oxidation layer as described above may be used as it is, but micro-pore enlarging treatment of an anodic oxidation layer, sealing treatment of micro-pores, and surface hydrophilizing treatment of immersing the support in an aqueous solution containing a hydrophilic compound as disclosed in Japanese Patent Application Nos. 2000-65219 and 2000-143387 may be performed arbitrarily for further improving adhering properties with the upper layer, hydrophilic properties, staining resistance and heat insulating properties, if necessary.

As the preferred hydrophilic compounds for the above hydrophilizing treatment, polyvinyl phosphonic acid, compounds having a sulfonic acid group, saccharide compounds, citric acid, alkali metal silicate, potassium zirconium fluoride, phosphate/inorganic fluorine compounds can be used in the present invention.

When a support, such as a polyester film, the surface of which is not sufficiently hydrophilic, is used as the support in the present invention, it is preferred to coat a hydrophilic layer to make the surface hydrophilic. A hydrophilic layer formed by coating a coating solution containing a colloidal oxide or hydroxide of at least one element selected from beryllium, magnesium, aluminum, silicon, titanium, boron, germanium, tin, zirconium, iron, vanadium, antimony and transition metals as disclosed in Japanese Patent Application No. 2000-10810 is preferred. A hydrophilic layer formed by coating a coating solution containing a colloidal oxide or hydroxide of silicon is preferred above all.

In the present invention, an inorganic undercoat layer containing a water-soluble metal salt, e.g., zinc borate, or an organic undercoat layer containing carboxymethyl cellulose, dextrin, or polyacrylic acid as disclosed in Japanese Patent Application No. 2000-143387 may be provided before coating an image-forming layer, if necessary.

This undercoat layer may contain the above-described infrared ray-absorbing dyes.

Plate-Making and Printing

An image is formed by heating on a lithographic printing plate precursor in the present invention. Specifically, an image is recorded by direct imagewise recording with a thermal recording head, scanning exposure with an infrared laser, high intensity flash exposure by a xenon discharge lamp, etc., and infrared lamp exposure. Exposure by solid state high output infrared lasers such as semiconductor lasers emitting infrared rays of wavelength of from 700 to 12,000 nm and YAG lasers is preferred in the present invention.

An image-exposed lithographic printing plate precursor according to the present invention can be loaded on a printing machine without requiring any further process, and printing can be performed using ink and a fountain solution by an ordinary procedure.

The lithographic printing plate precursor according to the present invention can also be subjected to exposure after being mounted on a plate cylinder by the laser installed on a printing machine, and then on-press development with a fountain solution and/or an ink, as disclosed in Japanese patent 2938398.

The lithographic printing plate precursor according to the present invention can also be used in printing after development with water or an aqueous solution as a developing solution.

EXAMPLE

The present invention will be illustrated in more detail with reference to examples below, but these are not to be construed as limiting the invention.

Synthesis Example of Fine Particles (11)

As oil phase components, 6.0 g of exemplified Polymer P-2 (a weight average molecular weight: 3,000), 1.5 g of an infrared ray-absorbing dye (exemplified Compound IR-26), 0.5 g of an acid precursor (exemplified Compound A1-14), and 0.1 g of an anionic surfactant Pionin A-41C (manufactured by Takemoto Yushi Co., Ltd.) were dissolved in 18.0 g of ethyl acetate, and the solution was mixed with 36.0 g of a 4% aqueous solution of polyvinyl alcohol (PVA205, manufactured by Kuraray Co., Ltd.) of a water phase component. The mixed solution was emulsified and dispersed with a homogenizer at 10,000 rpm for 10 minutes, then 24 g of water was added thereto, and the ethyl acetate was evaporated with stirring the mixed solution at 60° C. for 90 minutes. The concentration of the solid content of the thus-obtained fine particle dispersion solution was 13.0 wt % and the average particle size was 0.33 μm.

Synthesis Example of Fine Particles (12)

As oil phase components, 3.0 g of a bifunctional vinyloxy compound (exemplified Compound M-1), 3.0 g of a benzyl methacrylate/2-hydroxymethyl methacrylate/methacrylic acid copolymer in a copolymerization ratio of 60/20/20 (a weight average molecular weight: 30,000), 1.5 g of an infrared ray-absorbing dye (exemplified Compound IR-26), 0.5 g of an acid precursor (exemplified Compound A1-14), and 0.1 g of Pionin A-41C were dissolved in 18.0 g of ethyl acetate, and the solution was mixed with 36.0 g of a 4% aqueous solution of PVA205 of a water phase component. The mixed solution was emulsified and dispersed with a homogenizer at 10,000 rpm for 10 minutes, then 24 g of water was added thereto, and the ethyl acetate was evaporated with stirring the mixed solution at 60° C. for 90 minutes. The concentration of the solid content of the thus-obtained fine particle dispersion solution was 13.5 wt % and the average particle size was. 0.19 µm.

Synthesis Example of Fine Particles (13)

Acid Precursor was not Contained in Fine Particles

A fine particle dispersion solution was synthesized in the same manner as in the synthesis example of fine particles (12) except that the acid precursor was not added. The concentration of the solid content of the thus-obtained fine particle dispersion solution was 13.5 wt % and the average particle size was 0.25 µm.

Synthesis Example of Fine Particles (14)

Infrared Ray-absorbing Dye was not Contained in Fine Particles

A fine particle dispersion solution was synthesized in the same manner as in the synthesis example of fine particles (12) except that the infrared ray-absorbing dye was not added. The concentration of the solid content of the thus-obtained fine particle dispersion solution was 13.5 wt % and the average particle size was 0.30 µm.

Synthesis Example of Fine Particles (i) for Comparison

Vinyloxy Compound was not Contained in Fine Particles

As oil phase components, 6.0 g of an allyl methacrylate/methyl methacrylate copolymer (copolymerization molar ratio: 70/30, a weight average molecular weight: 15,000), 1.5 g of an infrared ray-absorbing dye (exemplified Compound IR-26), 0.5 g of an acid precursor (exemplified Compound A1-14), and 0.1 g of Pionin A-41C were dissolved in 18.0 g of ethyl acetate, and the solution was mixed with 36.0 g of a 4% aqueous solution of PVA205 of a water phase component. The mixed solution was emulsified and dispersed with a homogenizer at 10,000 rpm for 10 minutes, then 24 g of water was added thereto, and the ethyl acetate was evaporated with stirring the mixed solution at 60° C. for 90 minutes. The concentration of the solid content of the thus-obtained fine particle dispersion solution was 13.5 wt % and the average particle size was 0.2 µm.

Synthesis Example of Fine Particles (21)

As oil phase components, 6.0 g of Epikote 1004 (manufactured by Yuka Shell Epoxy Co., Ltd.), 1.5 g of an infrared ray-absorbing dye (exemplified Compound IR-26), 0.5 g of an acid precursor (exemplified Compound A2-10), and 0.1 g of an anionic surfactant Pionin A-41C (manufactured by Takemoto Yushi Co., Ltd.) were dissolved in 18.0 g of ethyl acetate, and the solution was mixed with 36.0 g of a 4% aqueous solution of polyvinyl alcohol (PVA205, manufactured by Kuraray Co., Ltd.) of a water phase component. The mixed solution was emulsified and dispersed with a homogenizer at 10,000 rpm for 10 minutes, then 24 g of water was added thereto, and the ethyl acetate was evaporated with stirring the mixed solution at 60° C. for 90 minutes. The concentration of the solid content of the thus-obtained fine particle dispersion solution was 12.5 wt % and the average particle size was 0.22 µm.

Synthesis Example of Fine Particles (22)

As oil phase components, 3.0 g of bisphenol A diglycidyl ether, 3.0 g of a benzyl methacrylate/2-hydroxymethyl methacrylate/methacrylic acid copolymer in a copolymerization ratio of 60/20/20 (a weight average molecular weight: 30,000), 1.5 g of an infrared ray-absorbing dye (exemplified Compound IR-26), 0.5 g of an acid precursor (exemplified Compound A2-10), and 0.1 g of Pionin A-41C were dissolved in 18.0 g of ethyl acetate, and the solution was mixed with 36.0 g of a 4% aqueous solution of PVA205 of a water phase component. The mixed solution was emulsified and dispersed with a homogenizer at 10,000 rpm for 10 minutes, then 24 g of water was added thereto, and the ethyl acetate was evaporated with stirring the mixed solution at 60° C. for 90 minutes. The concentration of the solid content of the thus-obtained fine particle dispersion solution was 13.0 wt % and the average particle size was 0.18 µm.

Synthesis Example of Fine Particles (23)

Acid Precursor was not Contained in Fine Particles

A fine particle dispersion solution was synthesized in the same manner as in the synthesis example of fine particles (22) except that the acid precursor was not added. The concentration of the solid content of the thus-obtained fine particle dispersion solution was 13.5 wt % and the average particle size was 0.25 µm.

Synthesis Example of Fine Particles (24)

Infrared Ray-absorbing Dye was not Contained in Fine Particles

A fine particle dispersion solution was synthesized in the same manner as in the synthesis example of fine particles (22) except that the infrared ray-absorbing dye was not added. The concentration of the solid content of the thus-obtained fine particle dispersion solution was 13.5 wt % and the average particle size was 0.30 µm.

Synthesis Example of Fine Particles (25)

A fine particle dispersion solution was synthesized in the same manner as in the synthesis example of fine particles (21) except that acid precursor A2-10 was replaced with A2-6. The concentration of the solid content of the thus-obtained fine particle dispersion solution was 13.5 wt % and the average particle size was 0.32 µm.

Synthesis Example of Fine Particles (ii) for Comparison

Epoxy Compound was not Contained in Fine Particles

As oil phase components, 6.0 g of an allyl methacrylate/methyl methacrylate copolymer (copolymerization molar ratio: 70/30, a weight average molecular weight: 15,000), 1.5 g of an infrared ray-absorbing dye (exemplified Compound IR-26), 0.5 g of an acid precursor (exemplified Compound A2-14), and 0.1 g of Pionin A-41C were dissolved in 18.0 g of ethyl acetate, and the solution was mixed with 36.0 g of a 4% aqueous solution of PVA205 of a water phase component. The mixed solution was emulsified and dispersed with a homogenizer at 10,000 rpm for 10 minutes, then 24 g of water was added thereto, and the ethyl acetate was evaporated with stirring the mixed solution at 60° C. for 90 minutes. The concentration of the solid content of the thus-obtained fine particle dispersion solution was 13.5 wt % and the average particle size was 0.2 μm.

Synthesis Example of Fine Particles (31)

Six point zero (6.0) grams of a phenolic resol resin having a weight average molecular weight of 2,000, 1.5 g of an infrared ray-absorbing dye (exemplified Compound IR-26), and 0.1 g of an anionic surfactant Pionin A-41C (manufactured by Takemoto Yushi Co., Ltd.) were dissolved in 21.0 g of ethyl acetate to form an oil phase, and the solution was mixed with 36.0 g of a 4% aqueous solution of polyvinyl alcohol (PVA205, manufactured by Kuraray Co., Ltd.) of a water phase component. The mixed solution was emulsified and dispersed with a homogenizer at 10,000 rpm for 10 minutes, then 24.0 g of water was added thereto, and the organic solvent was evaporated with heating the mixed solution at 50° C. for 3 hours. The concentration of the solid content of the thus-obtained fine particle dispersion solution was 15.0 wt % and the average particle size was 0.7 μm.

Synthesis Example of Fine Particles (32)

Six point zero (6.0) grams of an epoxy resin Epikote 1002 (manufactured by Yuka Shell Epoxy Co., Ltd.), 0.5 g of 1,8-diaminooctane, 1.5 g of an infrared ray-absorbing dye (exemplified Compound IR-26), and 0.1 g of Pionin A-41C (manufactured by Takemoto Yushi Co., Ltd.) were dissolved in 5.0 g of acetonitrile and 16.0 g of ethyl acetate to form an oil phase. A fine particle dispersion solution was synthesized in the same manner as in the synthesis example of fine particles (31) hereafter. The concentration of the solid content of the thus-obtained fine particle dispersion solution was 14.0 wt % and the average particle size was 0.4 μm.

Synthesis Example of Fine Particles (33)

Six point zero (6.0) grams of a phenol novolak resin having a weight average molecular weight of 7,000, 1.0 g of a low molecular weight thermosetting compound (a compound represented by formula (T-1)), 1.0 g of an infrared ray-absorbing dye (exemplified Compound IR-26), and 0.1 g of Pionin A-41C were dissolved in 21.0 g of ethyl acetate to form an oil phase. A fine particle dispersion solution was synthesized in the same manner as in the synthesis example of fine particles (31) hereafter. The concentration of the solid content of the thus-obtained fine particle dispersion solution was 15.0 wt % and the average particle size was 0.7 μm.

Synthesis Example of Fine Particles (34)

Six point zero (6.0) grams of a cresol novolak resin of polymerization ratio of m-/p- of 6/4 having a weight average molecular weight of 4,000, 1.0 g of hexamethoxymethylmelamine, 1.5 g of an infrared ray-absorbing dye (exemplified Compound IR-26), and 0.1 g of Pionin A-41C were dissolved in 10.0 g of acetonitrile and 11.0 g of ethyl acetate to form an oil phase. The same water phase as used in the synthesis example of fine particles (31) was added to the above solution and the mixture was emulsified with a homogenizer in the same manner as above, then 24.0 g of water was added to the emulsion, and then the organic solvent was evaporated with heating the emulsion at 60° C. for 3 hours. The concentration of the solid content of the thus-obtained fine particle dispersion solution was 20.0 wt % and the average particle size was 0.8 μm.

Synthesis Example of Fine Particles (35)

Six point zero (6.0) grams of a 100% oil-soluble phenolic resin (pp-3120, manufactured by Gun-ei Kagaku Kogyo Co., Ltd.), 1.5 g of an infrared ray-absorbing dye (exemplified Compound IR-26), and 0.1 g of Pionin A-41C were dissolved in 5.0 g of acetonitrile and 16.0 g of ethyl acetate to form an oil phase. A fine particle dispersion solution was synthesized in the same manner as in the synthesis example of fine particles (31) hereafter. The concentration of the solid content of the thus-obtained fine particle dispersion solution was 14.5 wt % and the average particle size was 0.9 μm.

Synthesis Example of Fine Particles (36)

Six point zero (6.0) grams of a phenolic resol resin having a weight average molecular weight of 2,000 and 0.1 g of Pionin A-41C were dissolved in 21.0 g of ethyl acetate to form an oil phase. A fine particle dispersion solution was synthesized in the same manner as in the synthesis example of fine particles (31) hereafter. The concentration of the solid content of the thus-obtained fine particle dispersion solution was 15.0 wt % and the average particle size was 0.7 μm.

Synthesis Example of Fine Particles (iii) for Comparison

Thermosetting Compound was not Contained in Fine Particles

Six point zero (6.0) grams of a polystyrene resin having a weight average molecular weight of 10,000, 1.5 g of an infrared ray-absorbing dye (exemplified Compound IR-26), and 0.1 g of Pionin A-41C were dissolved in 21.0 g of ethyl acetate to form an oil phase. A fine particle dispersion solution was synthesized in the same manner as in the synthesis example of fine particles (31) hereafter. The concentration of the solid content of the thus-obtained fine particle dispersion solution was 15.0 wt % and the average particle size was 0.7 μm.

Synthesis Example of Microcapsules (11)

As oil phase components, 40 g of the adduct of trimethylolpropane and xylylene diisocyanate (Takenate D-110N, a microcapsule wall material, manufactured by Takeda Chemical Industries Ltd.), 10 g of a bifunctional vinyloxy compound (exemplified Compound M-15), 10 g of a polymer having a vinyloxy group (exemplified Compound P-6), 1.5 g of an infrared ray-absorbing dye (exemplified Compound IR-26), 0.5 g of an acid precursor (exemplified Compound A1-8), and 0.1 g of Pionin A-41C were dissolved in 60 g of ethyl acetate. As a water phase component, 120 g of a 4% aqueous solution of PVA205 was prepared. The thus-obtained oil phase components and the water phase component were emulsified with a homogenizer at 10,000 rpm for 10 minutes, then 40 g of water was added thereto, and the solution was stirred at room temperature for 30 minutes and further at 40° C. for 3 hours. The concentration of the solid content of the thus-obtained microcapsule solution was 25 wt % and the average particle size was 0.5 μm.

Synthesis Example of Microcapsules (12)

As oil phase components, 40 g of Takenate D-110N, 10 g of a bifunctional vinyloxy compound (exemplified Compound M-15), 10 g of a polymer having a vinyloxy group (exemplified Compound P-6, a weight average molecular weight: 20,000), 10 g of poly-p-hydroxystyrene (a weight average molecular weight: 2,300), 1.5 g of an infrared ray-absorbing dye (exemplified Compound IR-26), 0.5 g of an acid precursor (exemplified Compound A1-8), and 0.1 g of Pionin A-41C were dissolved in 60 g of ethyl acetate. As a water phase component, 120 g of a 4% aqueous solution of PVA205 was prepared. The thus-obtained oil phase components and the water phase component were emulsified with a homogenizer at 10,000 rpm for 10 minutes, then 40 g of water was added thereto, and the solution was stirred at room temperature for 30 minutes and further at 40° C. for 3 hours. The concentration of the solid content of the thus-obtained microcapsule solution was 30 wt % and the average particle size was 0.5 μm.

Synthesis Example of Microcapsules (i) for Comparison

Vinyloxy Compound was not Contained in Microcapsules

As oil phase components, 40 g of Takenate D-110N, 10 g of trimethylolpropane diacrylate, 10 g of a copolymer of allyl methacrylate and butyl methacrylate (molar ratio: 60/40), 1.5 g of an infrared ray-absorbing dye (exemplified Compound IR-26), 0.5 g of an acid precursor (exemplified Compound A1-8), and 0.1 g of Pionin A-41C were dissolved in 60 g of ethyl acetate. As a water phase component, 120 g of a 4% aqueous solution of PVA205 was prepared. The thus-obtained oil phase components and the water phase component were emulsified with a homogenizer at 10,000 rpm for 10 minutes, then 40 g of water was added thereto, and the solution was stirred at room temperature for 30 minutes and further at 40° C. for 3 hours. The concentration of the solid content of the thus-obtained microcapsule solution was 27 wt % and the average particle size was 0.5 μm.

Synthesis Example of Microcapsules (21)

As oil phase components, 40 g of the adduct of trimethylolpropane and xylylene diisocyanate (Takenate D-110N, a microcapsule wall material, manufactured by Takeda Chemical Industries Ltd.), 10 g of a bifunctional epoxy compound (exemplified Compound M-15), 10 g of Sumiepoxy ESCN-195XHH (a novolak type epoxy resin manufactured by Sumitomo Chemical Co., Ltd.), 1.5 g of an infrared ray-absorbing dye (exemplified Compound IR-26), 0.5 g of an acid precursor (exemplified Compound A2-10), and 0.1 g of Pionin A-41C were dissolved in 60 g of ethyl acetate. As a water phase component, 120 g of a 4% aqueous solution of PVA205 was prepared. The thus-obtained oil phase components and the water phase component were emulsified with a homogenizer at 10,000 rpm for 10 minutes, then 40 g of water was added thereto, and the solution was stirred at room temperature for 30 minutes and further at 40° C. for 3 hours. The concentration of the solid content of the thus-obtained microcapsule solution was 23.0 wt % and the average particle size was 0.35 μm.

Synthesis Example of Microcapsules (22)

As oil phase components, 40 g of Takenate D-110N, 10 g of resorcin diglycidyl ether, 10 g of a methyl methacrylate/glycidyl methacrylate copolymer (copolymerization molar ratio: 50/50, a weight average molecular weight: 20,000), 10 g of poly-p-hydroxystyrene (a weight average molecular weight: 2,300), 1.5 g of an infrared ray-absorbing dye (exemplified Compound IR-26), 0.5 g of an acid precursor (exemplified Compound A2-10), and 0.1 g of Pionin A-41C were dissolved in 60 g of ethyl acetate. As a water phase component, 120 g of a 4% aqueous solution of PVA205 was prepared. The thus-obtained oil phase components and the water phase component were emulsified with a homogenizer at 10,000 rpm for 10 minutes, then 40 g of water was added thereto, and the solution was stirred at room temperature for 30 minutes and further at 40° C. for 3 hours. The concentration of the solid content of the thus-obtained microcapsule solution was 25.0 wt % and the average particle size was 0.30 μm.

Synthesis Example of Microcapsules (23)

A fine particle dispersion solution was synthesized in the same manner as in the synthesis of microcapsules (22) except that acid precursor A2-10 was replaced with A2-6. The concentration of the solid content of the thus-obtained microcapsule solution was 28.5 wt % and the average particle size was 0.40 μm.

Synthesis Example of Microcapsules (ii) for Comparison

Epoxy Compound was not Contained in Microcapsules

As oil phase components, 40 g of Takenate D-110N, 10 g of trimethylolpropane diacrylate, 10 g of a copolymer of allyl methacrylate and butyl methacrylate (molar ratio: 60/40), 1.5 g of an infrared ray-absorbing dye (exemplified Compound IR-26), 0.5 g of an acid precursor (exemplified Compound A-10), and 0.1 g of Pionin A-41C were dissolved in 60 g of ethyl acetate. As a water phase component, 120 g of a 4% aqueous solution of PVA205 was prepared. The thus-obtained oil phase components and the water phase component were emulsified with a homogenizer at 10,000 rpm for 10 minutes, then 40 g of water was added thereto, and the solution was stirred at room temperature for 30 minutes and further at 40° C. for 3 hours. The concentration of the solid content of the thus-obtained microcapsule solution was 27 wt % and the average particle size was 0.5 μm.

Examples I-1 to I-10 and Comparative Examples I-1 to I-4

A lithographic printing plate precursor was produced by coating each of the image-forming layer coating solutions (1) to (3) having the composition shown below on support (A) in the following preparation example by bar coating, each of the coated supports was dried in an oven at 80° C. for 90 seconds, thus each lithographic printing plate precursor having a dry coating amount of the image-forming layer of 1.0 g/m$^2$ was produced. Each coating solution used is shown in Table 1 below.

Preparation Example of Support (A)

The molten metal of JIS A1050 alloy containing 99.5% or more of aluminum, 0.30% of Fe, 0.10% of Si, 0.02% of Ti and 0.013% of Cu was subjected to purification treatment and casting. In the purification treatment, degassing treatment for eliminating unnecessary gases in the molten metal, such as hydrogen, and ceramic tube filter treatment were carried out. Casting was performed by DC casting method. The solidified ingot having a thickness of 500 mm underwent scalping in a thickness of 10 mm from the surface and homogenizing treatment was performed at 550° C. for 10 hours so that the intermetallic compound was not coarsened. In the next place, the plate was subjected to hot rolling at 400° C., then intermediate-annealing in a continuous annealing furnace at 500° C. for 60 seconds, and then cold rolling, to thereby produce an aluminum rolled plate having a thickness of 0.30 mm. The center line average surface roughness (Ra) (defined in JIS B 0601) of the aluminum plate surface after cold rolling was controlled to become 0.2 μm by controlling the roughness of pressure roll. The plate was then applied to a tension leveller for improving a flatness.

The plate was surface-treated to obtain a lithographic printing plate support.

In the first place, the aluminum plate was degreased with a 10% aqueous solution of sodium aluminate at 50° C. for 30 seconds to eliminate the rolling oil on the surface of the plate, neutralized in a 30% aqueous solution of sulfuric acid at 50° C. for 30 seconds, and then subjected to desmutting treatment.

In the next place, the surface of the support was subjected to graining treatment, i.e., surface roughening treatment, for improving adhering property of the support and the image-forming layer and giving water retentivity to the non-image domain. An aqueous solution containing 1% of nitric acid and 0.5% of aluminum nitrate was maintained at 45° C., and under the condition of electric current density of 20 A/dm$^2$ by indirect electric power supplying cell, the plate was subjected to electrolytic graining by supplying the quantity of electricity of anode of of anode of 240 C/dm$^2$, using alternating waveform of duty ratio of 1/1 with conveying the aluminum web in the aqueous solution. Subsequently, the plate underwent etching in a 10% sodium aluminate aqueous solution at 50° C. for 30 seconds, neutralization in a 30% sulfuric acid aqueous solution at 50° C. for 30 seconds, and then desmutting treatment.

Further, for improving abrasion resistance, chemical resistance and water retentivity, an oxide film was formed on the support by anodization. A 20% sulfuric acid aqueous solution was used as the electrolyte at 35° C. An anodic oxidation layer of 2.5 g/m$^2$ was formed by the electrolytic treatment with direct current of 14 A/dm$^2$ by indirect electric power supplying cell with conveying the aluminum web through the electrolyte.

Silicate treatment was performed for ensuring hydrophilic properties as the non-image domain of the printing plate hereafter. A 1.5% aqueous solution of sodium silicate No. 3 (i.e., disodium trisilicate) was maintained at 70° C. and the aluminum web was conveyed so that the contact time of the aluminum web with the aqueous solution became 15 seconds and the web was further washed with water. The adhered amount of Si was 10 mg/m$^2$. The center line average surface roughness (Ra) of the surface of the thus-obtained support (A) was 0.25 μm.

| Image-Forming Layer Coating Solution (1) | |
|---|---|
| Water | 100 g |
| Fine particles or microcapsules (in terms of solid content) | 5 g |
| Hydrophilic resin (shown in Table 1) | 0.5 g |
| Image-Forming Layer Coating Solution (2) (an infrared ray-absorbing dye was contained in the matrix of the image-forming layer) | |
| Water | 100 g |
| Fine particles or microcapsules (in terms of solid content) | 5 g |
| Hydrophilic resin (shown in Table 1) | 0.5 g |
| An infrared ray-absorbing dye (exemplified Compound IR-11) | 0.5 g |

| Image-Forming Layer Coating Solution (3) (an acid precursor was contained in the matrix of the image-forming layer) | |
|---|---|
| Water | 100 g |
| Fine particles or microcapsules (in terms of solid content) | 5 g |
| Hydrophilic resin (shown in Table 1) | 0.5 g |
| Acid precursor (exemplified Compound A1-17) | 0.5 g |

The thus-obtained lithographic printing plate precursor was subjected to exposure using Trendsetter mounting a water-cooling type 40 W infrared semiconductor laser manufactured by Creo Co., Ltd., under the conditions of output of 9 W, external drum rotating speed of 210 rpm, printing plate surface energy of 100 mJ/m$^2$, and resolution of 2,400 dpi. The exposed precursor was mounted on the cylinder of a printing machine SOR-M (manufactured by Heidelberg Co.) without further developing treatment, and printing was performed after feeding a fountain solution, then an ink, and then printing paper.

As a result, on-press development and printing were effected with every printing plate precursor with no problem. The printable number of sheets is shown in Table 1 below.

TABLE 1

Examples I-1 to I-10 and Comparative Examples I-1 to I-4

| Example No. | Kind of Image-Forming Layer Coating Solution | Kind of Fine Particles or Microcapsules | Kind of Hydrophilic Resin | Printable Number of Sheets |
|---|---|---|---|---|
| Example I-1 | (1) | Fine particles (11) | PAA | 20,000 |
| Example I-2 | (1) | Fine particles (11) | PHEA | 25,000 |
| Example I-3 | (1) | Fine particles (11) | PVP | 15,000 |
| Example I-4 | (1) | Fine particles (12) | PAA | 30,000 |
| Example I-5 | (3) | Fine particles (13) | PAA | 15,000 |
| Example I-6 | (2) | Fine particles (14) | PAA | 15,000 |
| Example I-7 | (1) | Microcapsule (11) | PAA | 25,000 |
| Example I-8 | (1) | Microcapsule (11) | PHEA | 25,000 |
| Example I-9 | (1) | Microcapsule (11) | PVP | 20,000 |
| Example I-10 | (1) | Microcapsule (12) | PAA | 35,000 |
| Comparative Example I-1 | (1) | Fine particles (i) | PAA | 10,000 |
| Comparative Example I-2 | (1) | Fine particles (i) | PVP | 8,000 |
| Comparative Example I-3 | (1) | Microcapsules (i) | PAA | 8,000 |
| Comparative Example I-4 | (1) | Microcapsules (i) | PVP | 10,000 |

In Table 1, the abbreviations are as follows:
PAA: Polyacrylic acid (weight average molecular weight: 25,000)
PHEA: Poly-2-hydroxyethyl acrylate (weight average molecular weight: 30,000)
PVP: Polyvinyl pyrrolidone (weight average molecular weight: 10,000)

It can be seen from the results in Table 1 that the lithographic printing plate precursors using the fine particles containing a compound having a vinyl oxy group or the microcapsules containing a compound having a vinyloxy group exhibited high press life (i.e., high printing durability). Further, the lithographic printing plate precursors containing an infrared ray-absorbing dye or an acid precursor in the fine particles or microcapsules exhibited higher press life than those containing the same in the outside of the fine particles or microcapsules. Moreover, the lithographic printing plate precursors using the hydrophilic resin having a carboxyl group or a hydroxyl group reacting with a vinyloxy group exhibited higher press life than those using the hydrophilic resin not having these groups.

Examples II-1 to II-10 and Comparative Examples II-1 to II-4

A lithographic printing plate precursor was produced by coating each of the image-forming layer coating solutions (4) to (7) having the composition shown below on the same support (A) used in the above Examples I by bar coating, the coated support was dried in an oven at 80° C. for 90 seconds, thus each lithographic printing plate precursor having a dry coating amount of the image-forming layer of 1.0 g/m² was produced. The combination of the coating solution is shown in Table 2 below.

| Image-Forming Layer Coating Solution (4) | |
|---|---|
| Water | 100 g |
| Fine particles or microcapsules (in terms of solid content) | 5 g |
| Hydrophilic resin (shown in Table 2) | 0.5 g |
| Image-Forming Layer Coating Solution (5) (an infrared ray-absorbing dye was contained in the matrix of the image-forming layer) | |
| Water | 100 g |
| Fine particles or microcapsules (in terms of solid content) | 5 g |
| Hydrophilic resin (shown in Table 2) | 0.5 g |
| An infrared ray-absorbing dye (exemplified Compound IR-11) | 0.5 g |
| Image-Forming Layer Coating Solution (6) (an acid precursor was contained in the matrix of the image-forming layer) | |
| Water | 95 g |
| Methanol | 5 g |
| Fine particles or microcapsules (in terms of solid content) | 5 g |
| Hydrophilic resin (shown in Table 2) | 0.5 g |
| Acid precursor (exemplified Compound A2-13) | 0.5 g |
| Image-Forming Layer Coating Solution (7) | |
| Water | 85 g |
| 1-Methoxy-2-propanol | 15 g |
| Microcapsules (in terms of solid content) | 5 g |
| Hydrophilic resin (shown in Table 2) | 0.5 g |

The thus-obtained lithographic printing plate precursor was subjected to exposure in the same manner as in Examples I and then printing was performed. As a result, on-press development and printing were effected with every printing precursor with no problem. The printable number of sheets is shown in Table 2 below.

TABLE 2

Examples II-1 to II-10 and Comparative Examples II-1 to II-4

| Example No. | Kind of Image-Forming Layer Coating Solution | Kind of Fine Particles or Microcapsules | Kind of Hydrophilic Resin | Printable Number of Sheets |
|---|---|---|---|---|
| Example II-1 | (4) | Fine particles (21) | PAA | 25,000 |
| Example II-2 | (4) | Fine particles (21) | PVP | 20,000 |
| Example II-3 | (4) | Fine particles (22) | PAA | 30,000 |
| Example II-4 | (4) | Fine particles (23) | PAA | 15,000 |
| Example II-5 | (6) | Fine particles (24) | PAA | 15,000 |
| Example II-6 | (5) | Fine particles (25) | PAA | 20,000 |
| Example II-7 | (7) | Microcapsule (21) | PAA | 20,000 |
| Example II-8 | (7) | Microcapsule (21) | PVP | 15,000 |
| Example II-9 | (7) | Microcapsule (22) | PAA | 25,000 |
| Example II-10 | (7) | Microcapsule (23) | PAA | 20,000 |
| Comparative Example II-1 | (4) | Fine particles (ii) | PAA | 10,000 |
| Comparative Example II-2 | (4) | Fine particles (ii) | PVP | 8,000 |
| Comparative Example II-3 | (7) | Microcapsules (ii) | PAA | 8,000 |
| Comparative Example II-4 | (7) | Microcapsules (ii) | PVP | 10,000 |

In Table 2, the abbreviations are as follows:
PAA: Polyacrylic acid (weight average molecular weight: 25,000)
PVP: Polyvinyl pyrrolidone (weight average molecular weight: 10,000)

It can be seen from the results in Table 2 that the lithographic printing plate precursors using the fine particles containing a compound having an epoxy group or the microcapsules containing a compound having an epoxy group exhibited high press life. Further, the lithographic printing plate precursors containing an infrared ray-absorbing dye or an acid precursor in the fine particles or microcapsules exhibited higher press life than those containing the same in the outside of the fine particles or microcapsules. Moreover, the lithographic printing plate precursors using the hydrophilic resin having a carboxyl group or a hydroxyl group reacting with an epoxy group exhibited higher press life than those using the hydrophilic resin not having these groups.

Examples III-1 to III-10 and Comparative Example III-1

A lithographic printing plate precursor was produced by coating each of the image-forming layer coating solutions (8) to (10) having the composition shown below on each of the supports prepared in Preparation Examples B1 to B7 by bar coating, each of the coated supports was dried in an oven at 90° C. for 120 seconds, thus each lithographic printing plate precursor having a dry coating amount of the image-forming layer of 1.2 g/m² was produced. The combination of the coating solution and the support is shown in Table 3 below.

Preparation Example of Support B1

A rolled plate having a thickness of 0.24 mm of JIS-A-1050 aluminum containing 0.01% of copper, 0.03% of titanium, 0.3% of iron, and 0.1% of silicon was surface-grained with a 20 wt % aqueous suspension of 400 mesh pumice stone powder (manufactured by Kyoritsu Yogyo Co., Ltd.) and a rotary nylon brush (6,10-nylon) having a (hair) diameter of 0.30 mm, and then the plate was thoroughly washed with water.

The plate was immersed in a 15 wt % aqueous solution of sodium hydroxide (containing 5 wt % of aluminum) and etched so as to reach the dissolving amount of the aluminum of 5 g/m², then washed with flowing water, followed by neutralization with a 1 wt % aqueous solution of nitric acid. Subsequently, the plate was subjected to electrolytic surface roughening treatment in a 0.7 wt % aqueous solution of nitric acid (containing 0.5% of aluminum ions) using rectangular alternating wave form voltage (electric current ratio r=0.90, electric current wave form disclosed in JP-B-58-5796) of the voltage of 9.3 V at the cathode time and the voltage of 10.5 V at the anode time, with the quantity of electricity of 110 Coulomb/dm$^2$ at the anode time. After washing with water, the plate was immersed in a 10 wt % aqueous solution of sodium hydroxide at 40° C. and etched so as to reach the dissolving amount of the aluminum of 1 g/m$^2$, and then washed with water. The plate was then immersed in a 30% aqueous solution of sulfuric acid at 50° C., desmutted, and washed with water.

Further, the plate was subjected to anodizing treatment in a 20 wt % aqueous solution of sulfuric acid (containing 0.8% of aluminum ions) at 35° C. using direct current to form a porous anodic oxidation layer. That is, electrolysis was performed at electric current density of 13 A/dm$^2$, thereby a support having an anodic oxidation layer weight of 4.0 g/m$^2$ was obtained by controlling the electrolysis time, and the aluminum support was washed with water and dried.

The thus-obtained aluminum support had reflection density of 0.28 and center line average surface roughness (Ra) of 0.45 μm. The reflection density was measured by a Macbeth RD920 reflection densitometer. (This semi-finished support is hereinafter called "support (B)".)

Support (B) was subjected to immersion treatment in a 0.5 wt % aqueous solution of polyvinylsulfonic acid at 60° C. for 10 seconds, and then washed with water and dried, thereby support (B1) was obtained.

Preparation Example of Support B2

Support (B) was subjected to immersion treatment in a 0.1 wt % aqueous solution of sodium lignin sulfonate (pH 5.5) at 80° C. for 60 seconds, and then washed with water and dried, thereby support (B2) was obtained.

Preparation Example of Support B3

Support (B) was subjected to immersion treatment in a 1 wt % aqueous solution of saponin (pH 5.5) at 40° C. for 30 seconds, and then washed with water and dried, thereby support (B3) was obtained.

Preparation Example of Support B4

Support (B) was subjected to immersion treatment in a 5 wt % aqueous solution of citric acid at 50° C. for 60 seconds, and then washed with water and dried, thereby support (B4) was obtained.

Preparation Example of Support B5

Support (B) was subjected to immersion treatment in a 2.5 wt % aqueous solution of sodium silicate at 70° C. for 12 seconds, and then washed with water and dried, thereby support (B5) was obtained.

Preparation Example of Support B6

Support (B) was subjected to immersion treatment in a 1.5 wt % aqueous solution of potassium zirconium fluoride at 60° C. for 60 seconds, and then washed with water and dried, thereby support (B6) was obtained.

Preparation Example of Support B7

Support (B) was subjected to immersion treatment in an aqueous solution of $NaH_2PO_4/NaF$ (10 wt %/0.1 wt %) at 70° C. for 30 seconds, and then washed with water and dried, thereby support (B7) was obtained.

| Image-Forming Layer Coating Solution (8) | |
|---|---|
| Water | 30 g |
| Fine particles (in terms of solid content) | 2.0 g |
| Megafac F-171 (fluorine-containing surfactant, manufactured by Dai-Nippon Ink & Chemicals Inc.) | 0.1 g |
| Polyvinyl alcohol (PVA PVA205, manufactured by Kuraray Co., Ltd.) | 0.2 g |
| Hexamethoxymethylmelamine | 0.02 g |
| Image-Forming Layer Coating Solution (9) | |
| Water | 30 g |
| Fine particles (in terms of solid content) | 2.0 g |
| Megafac F-171 | 0.1 g |
| Polyethylene glycol (weight average molecular weight: 2,000) | 0.2 g |
| Hexamethoxymethylmelamine | 0.02 g |
| Image-Forming Layer Coating Solution (10) | |
| Water | 30 g |
| Fine particles (in terms of solid content) | 2.0 g |
| Megafac F-171 | 0.1 g |
| Polyvinyl pyrrolidone (weight average molecular weight: 20,000) | 0.2 g |
| Hexamethoxymethylmelamine | 0.02 g |

Thus-obtained lithographic printing plate precursor capable of on-press development was subjected to exposure in the same manner as in Example I and printing was performed. As a result, on-press development and printing were effected with every printing plate precursor with no problem. The printable number of sheets of every printing plate and the level of staining resistance are shown in Table 3 below.

TABLE 3

Examples III-1 to III-16 and Comparative Example III-1

| Example No. | Support | Kind of Image-Forming Layer Coating Solution | Kind of Fine Particles | Printable Number of Sheets | Staining Resistance |
|---|---|---|---|---|---|
| Example III-1 | B1 | (8) | (31) | 20,000 | Good |
| Example III-2 | B2 | (8) | (31) | 22,000 | Good |
| Example III-3 | B3 | (8) | (31) | 21,000 | Good |
| Example III-4 | B4 | (8) | (31) | 24,000 | Good |
| Example III-5 | B5 | (8) | (31) | 23,000 | Good |
| Example III-6 | B6 | (8) | (31) | 22,000 | Good |
| Example III-7 | B7 | (8) | (31) | 21,000 | Good |
| Example III-8 | B5 | (8) | (32) | 23,000 | Good |
| Example III-9 | B5 | (8) | (33) | 23,000 | Good |
| Example III-10 | B5 | (8) | (34) | 22,000 | Good |
| Example III-11 | B5 | (8) | (35) | 24,000 | Good |
| Example III-12 | B5 | (8) | (36) | 23,000 | Good |
| Example III-13 | B5 | (9) | (31) | 35,000 | Good |
| Example III-14 | B5 | (10) | (31) | 30,000 | Good |
| Example III-15 | B5 | (9) | (32) | 22,000 | Good |
| Example III-16 | B5 | (10) | (32) | 23,000 | Good |
| Comparative Example III-1 | B5 | (8) | (iii) | 1,000 | Good |

It can be seen from the above results that the lithographic printing plate precursors according to the present invention have good on-press developing property, excellent press life and staining resistance.

Effect of the Invention

The present invention can provide a lithographic printing plate precursor capable of plate-making by scanning exposure on the basis of digital signals and having good on-press developing property and excellent press life.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor which comprises a hydrophilic support having provided thereon an image-forming layer containing a hydrophilic resin and fine particles containing a thermosetting compound wherein the thermosetting compound is at least a resin selected from a resin having a phenolic skeleton, a melamine resin and a urea resin and wherein the resin having a phenolic skeleton is obtained by resinifying phenol or cresol with aldehydes, hydroxystyrene resins, N-(p-hydroxyphenyl)methacrylamide or N-(p-hydroxyphenyl)methacrylate.

2. The lithographic printing plate precursor as claimed in claim 1, wherein the fine particles containing a thermosetting compound contain an infrared ray-absorbing dye.

3. The lithographic printing plate precursor as claimed in claim 1, wherein the hydrophilic support is an aluminum support which has been subjected to anodization treatment and hydrophilization treatment.

4. The lithographic printing plate precursor as claimed in claim 1, wherein the printing plate precursor is development processed on a printing machine.

5. A lithographic printing plate precursor 95 capable of development processing on a printing machine by supplying a fountain solution and ink, which comprises a hydrophilic support having provided thereon an image-forming layer containing an infrared absorbing dye, a hydrophilic resin and fine particles containing a thermosetting compound, wherein the thermosetting compound is at least a resin selected from a resin having a phenolic skeleton, a melamine resin and a urea resin and wherein the resin having a phenolic skeleton is obtained by resinifying phenol or cresol with aldehydes, hydroxystyrene resins, N-(p-hydroxyphenyl)methacrylamide or N-(p-hydroxyphenyl)methacrylate.

* * * * *